(12) United States Patent
Yamazaki

(10) Patent No.: US 10,269,563 B2
(45) Date of Patent: *Apr. 23, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/978,374

(22) Filed: Dec. 22, 2015

(65) Prior Publication Data

US 2016/0111280 A1 Apr. 21, 2016

Related U.S. Application Data

(63) Continuation of application No. 14/270,657, filed on May 6, 2014, now Pat. No. 9,355,844, which is a
(Continued)

(30) Foreign Application Priority Data

Sep. 3, 2010 (JP) ................................. 2010-197749
Dec. 24, 2010 (JP) ................................. 2010-287403

(51) Int. Cl.
*H01L 21/02* (2006.01)
*H01L 29/786* (2006.01)
(Continued)

(52) U.S. Cl.
CPC .. *H01L 21/02565* (2013.01); *H01L 21/02488* (2013.01); *H01L 21/02554* (2013.01);
(Continued)

(58) Field of Classification Search
CPC ............. H01L 21/02565; H01L 21/283; H01L 29/66969; H01L 21/02488; H01L 29/7869;
(Continued)

(56) References Cited

U.S. PATENT DOCUMENTS 5,429,983 A 7/1995 Takizawa et al.
5,528,032 A 6/1996 Uchiyama
(Continued)

FOREIGN PATENT DOCUMENTS

CN 101728275 A 6/2010
EP 1737044 A 12/2006
(Continued)

OTHER PUBLICATIONS

Invitation to pay additional fees (Application No. PCT/JP2011/068995), International Searching Authority, dated Sep. 20, 2011.
(Continued)

*Primary Examiner* — Jarrett J Stark
(74) *Attorney, Agent, or Firm* — Robinson Intellectual Property Law Office; Eric J. Robinson

(57) ABSTRACT

Electrical characteristics of transistors using an oxide semiconductor are greatly varied in a substrate, between substrates, and between lots, and the electrical characteristics are changed due to heat, bias, light, or the like in some cases. In view of the above, a semiconductor device using an oxide semiconductor with high reliability and small variation in electrical characteristics is manufactured. In a method for manufacturing a semiconductor device, hydrogen in a film and at an interface between films is removed in a transistor using an oxide semiconductor. In order to remove hydrogen at the interface between the films, the substrate is transferred under a vacuum between film formations. Further, as for a substrate having a surface exposed to the air, hydrogen on
(Continued)

the surface of the substrate may be removed by heat treatment or plasma treatment.

18 Claims, 18 Drawing Sheets

Related U.S. Application Data continuation of application No. 13/211,588, filed on Aug. 17, 2011, now Pat. No. 8,728,860.

(51) Int. Cl.
*H01L 29/66* (2006.01)
*H01L 21/283* (2006.01)

(52) U.S. Cl.
CPC ...... *H01L 21/02631* (2013.01); *H01L 21/283* (2013.01); *H01L 29/66969* (2013.01); *H01L 29/7869* (2013.01); *H01L 29/78603* (2013.01)

(58) Field of Classification Search
CPC ......... H01L 21/02554; H01L 21/02631; H01L 29/78603
See application file for complete search history.

(56) References Cited

U.S. PATENT DOCUMENTS

| | | |
|---|---|---|
| 5,548,156 A | 8/1996 | Miwa et al. |
| 5,580,797 A | 12/1996 | Miwa et al. |
| 5,629,217 A | 5/1997 | Miwa et al. |
| 5,731,856 A | 3/1998 | Kim et al. |
| 5,744,864 A | 4/1998 | Cillessen et al. |
| 5,783,472 A | 7/1998 | Miwa et al. |
| 5,786,258 A | 7/1998 | Miwa et al. |
| 6,294,274 B1 | 9/2001 | Kawazoe et al. |
| 6,514,804 B1 | 2/2003 | Yamaguchi |
| 6,563,174 B2 | 5/2003 | Kawasaki et al. |
| 6,593,229 B1 | 7/2003 | Yamamoto et al. |
| 6,727,522 B1 | 4/2004 | Kawasaki et al. |
| 6,737,341 B1 | 5/2004 | Yamamoto et al. |
| 6,936,550 B2 | 8/2005 | Yamamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,812,346 B2 | 10/2010 | Shieh et al. |
| 7,829,444 B2 | 11/2010 | Yabuta et al. |
| 7,855,379 B2 | 12/2010 | Hayashi et al. |
| 7,868,326 B2 | 1/2011 | Sano et al. |
| 7,884,360 B2 | 2/2011 | Takechi et al. |
| 7,915,075 B2 | 3/2011 | Suzawa et al. |
| 7,994,508 B2 | 8/2011 | Ye |
| 8,067,775 B2 | 11/2011 | Miyairi et al. |
| 8,084,307 B2 | 12/2011 | Itagaki et al. |
| 8,129,719 B2 | 3/2012 | Yamazaki et al. |
| 8,183,099 B2 | 5/2012 | Sakata |
| 8,193,045 B2 | 6/2012 | Omura et al. |
| 8,203,144 B2 | 6/2012 | Hoffman et al. |
| 8,232,552 B2 | 7/2012 | Yano et al. |
| 8,258,023 B2 | 9/2012 | Lee |
| 8,269,217 B2 | 9/2012 | Arai et al. |
| 8,274,082 B2 | 9/2012 | Ferrao De Paiva Martins et al. |
| 8,362,693 B2 * | 1/2013 | Yamazaki ........... H01L 27/3246 313/504 |
| 8,367,489 B2 | 2/2013 | Yamazaki |
| 8,420,442 B2 | 4/2013 | Takechi et al. |
| 8,436,349 B2 | 5/2013 | Sano et al. |
| 8,461,583 B2 | 6/2013 | Yano et al. |
| 8,497,504 B2 | 7/2013 | Arai et al. |
| 8,508,276 B2 * | 8/2013 | Hatano ............... H01L 27/1156 326/103 |
| 8,508,967 B2 * | 8/2013 | Yamazaki ............. G11C 5/025 365/149 |
| 8,513,054 B2 * | 8/2013 | Sasaki ................. H01L 29/7869 257/E21.411 |
| 8,563,977 B2 | 10/2013 | Shimada et al. |
| 8,647,031 B2 | 2/2014 | Hoffman et al. |
| 8,728,860 B2 | 5/2014 | Yamazaki |
| 8,785,240 B2 | 7/2014 | Watanabe |
| 8,803,149 B2 | 8/2014 | Sakata |
| 8,822,264 B2 | 9/2014 | Yamazaki et al. |
| 8,879,010 B2 | 11/2014 | Yamazaki |
| 8,889,480 B2 | 11/2014 | Takechi et al. |
| 8,912,040 B2 | 12/2014 | Suzawa et al. |
| 9,029,851 B2 | 5/2015 | Miyairi et al. |
| 9,209,026 B2 | 12/2015 | Takechi et al. |
| 9,318,512 B2 | 4/2016 | Miyairi et al. |
| 9,355,844 B2 | 5/2016 | Yamazaki |
| 9,373,525 B2 | 6/2016 | Suzawa et al. |
| 9,599,860 B2 | 3/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0015719 A1 | 1/2003 | Haga |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0152340 A1 | 8/2004 | Yamamoto et al. |
| 2004/0256672 A1 | 12/2004 | Tsuchiya |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0046335 A1 | 3/2006 | Sarma et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231872 A1 | 10/2006 | Kim et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 * | 3/2007 | Saito .................. H01L 27/1248 313/506 |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |

(56) References Cited

U.S. PATENT DOCUMENTS

| | | |
|---|---|---|
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308911 A1* | 12/2008 | Okamoto ............ H01L 29/4908 257/623 |
| 2008/0315193 A1 | 12/2008 | Kim et al. |
| 2009/0035899 A1 | 2/2009 | Herman et al. |
| 2009/0065777 A1 | 3/2009 | Oue et al. |
| 2009/0068773 A1 | 3/2009 | Lai et al. |
| 2009/0073325 A1 | 3/2009 | Kuwabara et al. |
| 2009/0081842 A1 | 3/2009 | Nelson et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0146150 A1 | 6/2009 | Hosoya |
| 2009/0152506 A1 | 6/2009 | Umeda et al. |
| 2009/0152541 A1 | 6/2009 | Maekawa et al. |
| 2009/0167974 A1 | 7/2009 | Choi et al. |
| 2009/0200615 A1 | 8/2009 | Kanegae et al. |
| 2009/0230389 A1 | 9/2009 | Chen et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0294808 A1* | 12/2009 | Ito ..................... H01L 21/67132 257/288 |
| 2010/0025677 A1 | 2/2010 | Yamazaki et al. |
| 2010/0051940 A1 | 3/2010 | Yamazaki et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159639 A1 | 6/2010 | Sakata |
| 2010/0267198 A1 | 10/2010 | Yabuta et al. |
| 2010/0276688 A1 | 11/2010 | Yano et al. |
| 2010/0308324 A1 | 12/2010 | Kim et al. |
| 2011/0003429 A1* | 1/2011 | Oikawa ............... H01L 29/7869 438/104 |
| 2011/0012118 A1* | 1/2011 | Yamazaki ............ H01L 27/1225 257/59 |
| 2011/0124153 A1* | 5/2011 | Hosoba ............... H01L 21/02554 438/104 |
| 2012/0058598 A1 | 3/2012 | Yamazaki |
| 2012/0132911 A1 | 5/2012 | Shimada et al. |
| 2012/0319106 A1* | 12/2012 | Yamazaki ............ H01L 27/1225 257/43 |
| 2013/0137255 A1 | 5/2013 | Yamade et al. |
| 2015/0037912 A1 | 2/2015 | Sakata |
| 2015/0050774 A1 | 2/2015 | Yamazaki et al. |
| 2016/0197166 A1 | 7/2016 | Miyairi et al. |
| 2016/0284739 A1 | 9/2016 | Suzawa et al. |
| 2017/0178580 A1 | 6/2017 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-335530 A | 12/1993 |
| JP | 06-275697 A | 9/1994 |
| JP | 08-264794 A | 10/1996 |
| JP | 10-303385 A | 11/1998 |
| JP | 11-505377 | 5/1999 |
| JP | 2000-044236 A | 2/2000 |
| JP | 2000-150900 A | 5/2000 |
| JP | 2000-349285 A | 12/2000 |
| JP | 2002-076356 A | 3/2002 |
| JP | 3298974 | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-012110 A | 1/2005 |
| JP | 2006-165528 A | 6/2006 |
| JP | 2006-526273 | 11/2006 |
| JP | 2007-073560 A | 3/2007 |
| JP | 2007-096055 A | 4/2007 |
| JP | 2007-529119 | 10/2007 |
| JP | 2007-311404 A | 11/2007 |
| JP | 2008-042088 A | 2/2008 |
| JP | 2008-060419 A | 3/2008 |
| JP | 2010-021170 A | 1/2010 |
| JP | 2010-040552 A | 2/2010 |
| JP | 2010-056541 A | 3/2010 |
| JP | 2010-080947 A | 4/2010 |
| JP | 2010-518619 | 5/2010 |
| JP | 2010-123938 A | 6/2010 |
| JP | 2010-166030 A | 7/2010 |
| JP | 2010-183027 A | 8/2010 |
| JP | 2011-170345 A | 9/2011 |
| JP | 2012-146946 A | 8/2012 |
| KR | 2001-0020941 A | 3/2001 |
| KR | 2010-0014167 A | 2/2010 |
| TW | 200631090 | 9/2006 |
| TW | 200915577 | 4/2009 |
| TW | 200929546 | 7/2009 |
| WO | WO-2004/105139 | 12/2004 |
| WO | WO-2004/114391 | 12/2004 |
| WO | WO-2005/093850 | 10/2005 |
| WO | WO-2008/097117 | 8/2008 |
| WO | WO-2008/149873 | 12/2008 |
| WO | WO-2009/041544 | 4/2009 |
| WO | WO-2010/009128 | 1/2010 |
| WO | WO-2010/047217 | 4/2010 |
| WO | WO-2010/071034 | 6/2010 |
| WO | WO-2010/098101 | 9/2010 |
| WO | WO-2012/029596 | 3/2012 |

OTHER PUBLICATIONS

International Search Report (Application No. PCT/JP2011/068995) dated Nov. 15, 2011.

Written Opinion (Application No. PCT/JP2011/068995) dated Nov. 15, 2011.

Fortunato.E et al., "Wide-Bandgap High-Mobiltiy ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AMOLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Taiwanese Office Action (Application No. 105112437) dated Nov. 22, 2016.

Taiwanese Office Action (Application No. 106127804) dated Nov. 29, 2017.

* cited by examiner

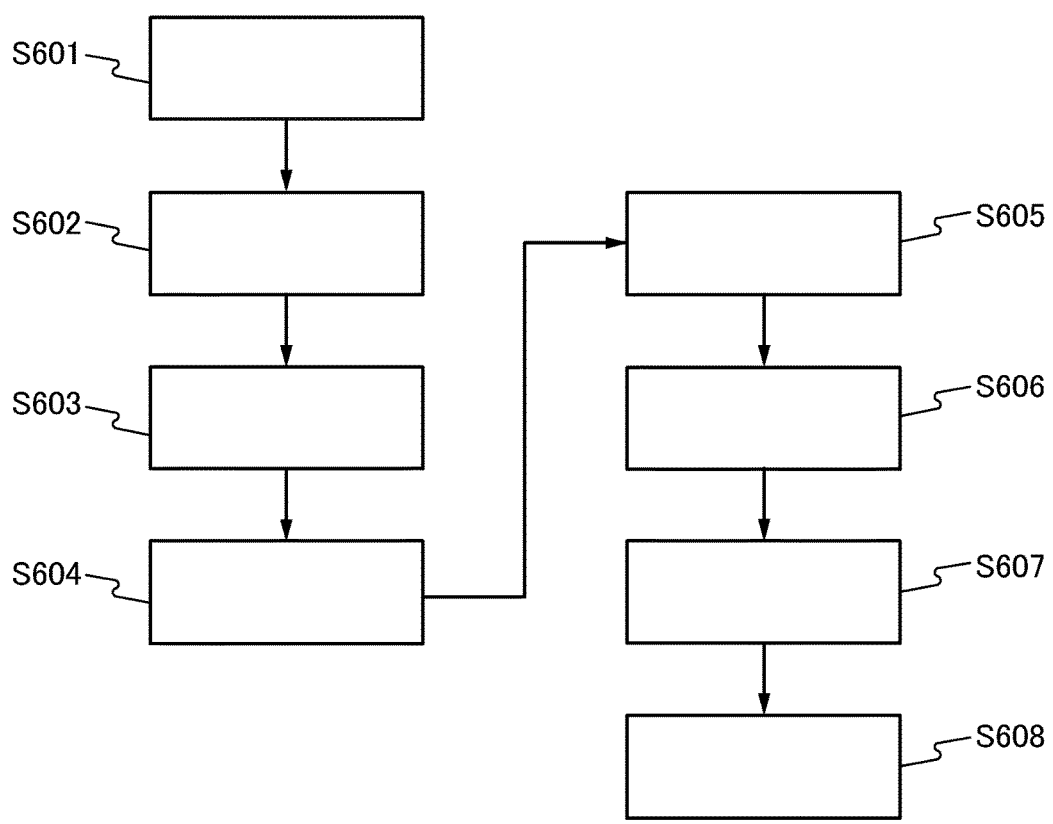

METHOD FOR MANUFACTURING SEMICONDUCTOR DEVICE

TECHNICAL FIELD

The present invention relates to a film formation apparatus and a method for manufacturing a semiconductor device using the film formation apparatus.

Note that in this specification, a semiconductor device refers to any device that can function by utilizing semiconductor characteristics, and an electro-optical device, a semiconductor circuit, and an electronic device are all semiconductor devices.

BACKGROUND ART

In recent years, attention has been focused on a technique for forming transistors using semiconductor thin films formed over a substrate having an insulating surface. The transistors are applied to a wide range of electronic devices such as an integrated circuit (IC) or an image display device (display device). As materials of semiconductor thin films applicable to the transistors, silicon-based semiconductor materials have been widely known, but oxide semiconductors have been attracting attention as alternative materials.

For example, disclosure is made of a transistor having an active layer for which an oxide semiconductor that contains indium (In), gallium (Ga), and zinc (Zn) and has an electron carrier concentration less than $10^{18}/cm^3$ is used, and a sputtering method is considered the most suitable as a method for forming a film of the oxide semiconductor (see Patent Document 1).

REFERENCE

[Patent Document 1] Japanese Published Patent Application No. 2006-165528

DISCLOSURE OF INVENTION

Electrical characteristics of transistors using an oxide semiconductor are greatly varied in a substrate, between substrates, and between lots, and the electrical characteristics are changed due to heat, bias, light, or the like in some cases. In view of the above, an object is to manufacture a semiconductor device using an oxide semiconductor with high reliability and small variation in electrical characteristics.

It is known that in a transistor using an oxide semiconductor, part of hydrogen serves as a donor to generate an electron. The generation of an electron causes drain current to flow even without applying a gate voltage; thus, the threshold voltage shifts in the negative direction. A transistor using an oxide semiconductor is likely to have n-type conductivity, and it comes to have normally-on characteristics by a shift of threshold voltage in the negative direction. Here, "normally on" means a state where a channel exists without applying voltage to a gate electrode and current flows through a transistor.

Further, the threshold voltage of a transistor might change due to entry of hydrogen into an oxide semiconductor film after manufacturing the transistor. A change in the threshold voltage significantly impairs the reliability of the transistor.

The present inventor has found that film formation causes unintended inclusion of hydrogen in a film. Note that in this specification, "hydrogen" refers to a hydrogen atom or a hydrogen ion and for example, includes hydrogen derived from a hydrogen molecule, hydrocarbon, a hydroxyl group, water, and the like in the expression "including hydrogen".

One embodiment of the present invention is a method for manufacturing a semiconductor device by which hydrogen in a film and at an interface between films is removed in a transistor using an oxide semiconductor. In order to remove hydrogen at an interface between films, a substrate is not exposed to the air between film formations. The substrate is preferably transferred under a vacuum. Further, as for a substrate having a surface exposed to the air, hydrogen on the surface of the substrate may be removed by heat treatment or plasma treatment.

In order to remove hydrogen in a film, hydrogen on a surface of a substrate over which a film is to be formed, hydrogen in a material of the film, and hydrogen in a film formation chamber are reduced.

Hydrogen taken into the film may be removed by heat treatment or plasma treatment.

Heat treatment or plasma treatment may be performed in order to reduce the hydrogen concentration of the surface of the substrate over which a film is to be formed and the hydrogen concentration of the film.

In one embodiment of the present invention, heat treatment is performed in an inert atmosphere, a reduced-pressure atmosphere, or a dry air atmosphere. Further, the inert atmosphere refers to an atmosphere containing an inert gas (such as nitrogen or a rare gas (e.g., helium, neon, argon, krypton, or xenon)) as the main component, and preferably contains no hydrogen. For example, the purity of the inert gas to be introduced is greater than or equal to 8N (99.999999%), preferably greater than or equal to 9N (99.9999999%). Alternatively, the inert atmosphere refers to an atmosphere that contains an inert gas as the main component and contains a reactive gas at a concentration less than 0.1 ppm. The reactive gas is a gas that reacts with a semiconductor, metal, or the like. The reduced-pressure atmosphere refers to an atmosphere with a pressure of lower than or equal to 10 Pa. The dry air atmosphere is a dew point lower than or equal to −40° C., preferably a dew point lower than or equal to −50° C.

The plasma treatment can be performed at low temperature and can remove hydrogen efficiently in a short time. In particular, the plasma treatment is effective in removing hydrogen strongly bonded to a surface of a substrate.

Further, entry of hydrogen from the outside can be suppressed by films between which a transistor is interposed and which block hydrogen.

According to one embodiment of the present invention, hydrogen contained in an oxide semiconductor film can be reduced, and a transistor having stable electrical characteristics with less variation in threshold voltage can be provided.

Alternatively, according to one embodiment of the present invention, hydrogen in a film in contact with an oxide semiconductor film can be reduced, and thus entry of hydrogen into the oxide semiconductor film can be suppressed. Consequently, a semiconductor device having a transistor with favorable electrical characteristics and high reliability can be provided.

BRIEF DESCRIPTION OF DRAWINGS

FIG. 6 is a flow chart showing a path of a substrate in a process of manufacturing a semiconductor device that is one embodiment of the present invention.

BEST MODE FOR CARRYING OUT THE INVENTION

Figure 1:
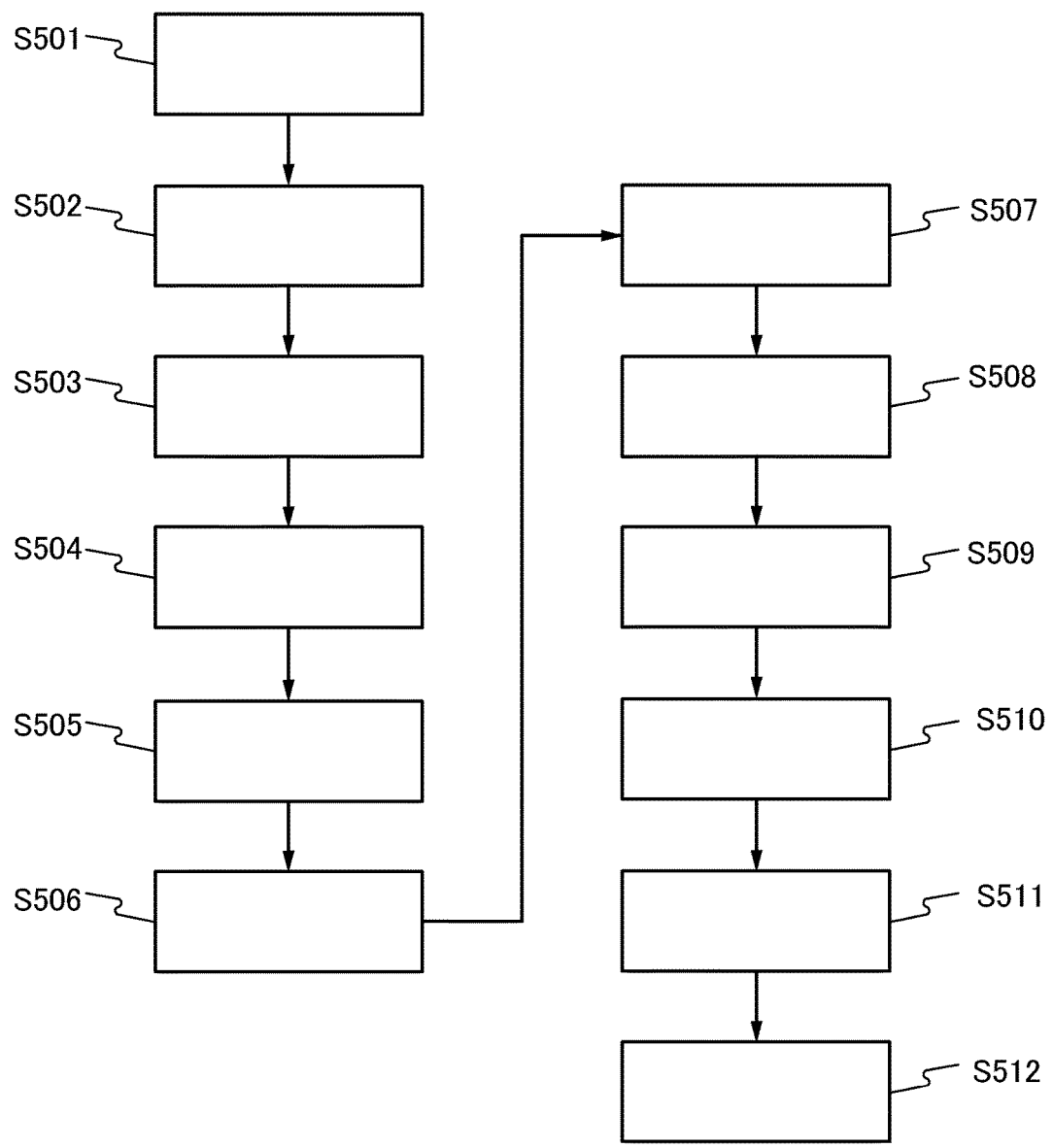
FIG. 1 is a flow chart showing a path of a substrate in a process of manufacturing a semiconductor device that is one embodiment of the present invention.

Hereinafter, embodiments of the present invention will be described in detail with reference to the accompanying drawings. However, the present invention is not limited to the following description, and it is easily understood by those skilled in the art that modes and details disclosed herein can be modified in various ways. Further, the present invention is not construed as being limited to description of the following embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, description is made on a method for manufacturing a top-gate top-contact transistor using an oxide semiconductor with less entry of hydrogen into a film and an interface between films.

FIG. 1 is a flow chart showing a path of a substrate in a multi-chamber film formation apparatus. FIGS. 2A to 2D are cross-sectional views that shows a method for manufacturing a semiconductor device and corresponds to the flow diagram in FIG. 1.

Figure 3:
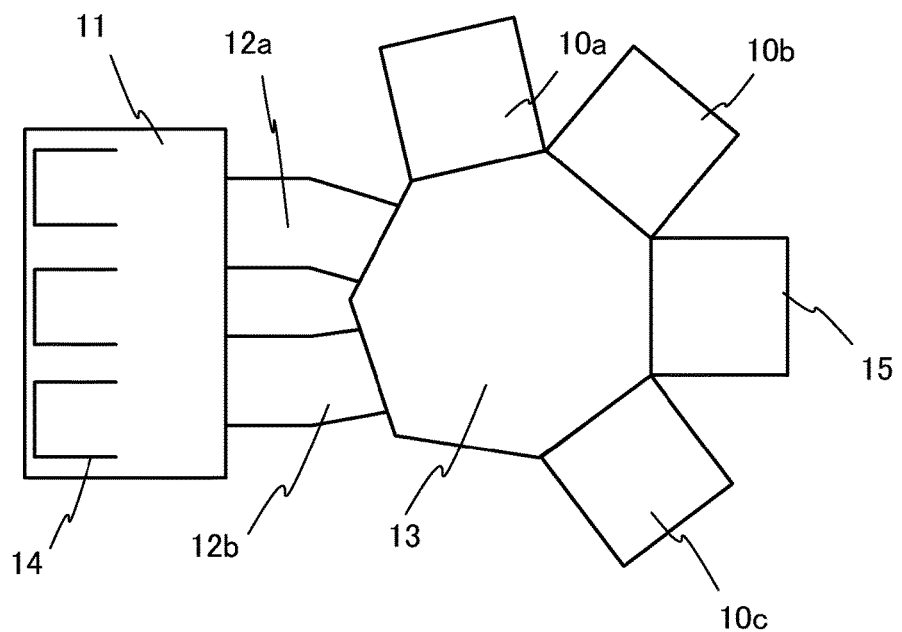
FIG. 3 is a top view showing an example of a film formation apparatus that is one embodiment of the present invention.

FIG. 3 is a multi-chamber film formation apparatus. The film formation apparatus includes a substrate supply chamber 11 having three cassette ports 14 accommodating a substrate, a load lock chamber 12a, a load lock chamber 12b, a transfer chamber 13, a substrate processing chamber 15, a film formation chamber 10a with a leakage rate less than or equal to $1 \times 10^{-10}$ Pa·m$^3$/sec, a film formation chamber 10b with a leakage rate less than or equal to $1 \times 10^{-10}$ Pa·m$^3$/sec, and a film formation chamber 10c with a leakage rate less than or equal to $1 \times 10^{-10}$ Pa·m$^3$/sec. The substrate supply chamber is connected to the load lock chamber 12a and the load lock chamber 12b. The load lock chamber 12a and the load lock chamber 12b are connected to the transfer chamber 13. The substrate processing chamber 15 and the film formation chambers 10a to 10c are each connected only to the transfer chamber 13. A gate valve is provided for a connecting portion of each chamber so that each chamber can be independently kept in a vacuum state. Note that a film formation gas having a purity greater than or equal to 99.999999% can be introduced into the film formation chambers 10a to 10c. Although not shown, the transfer chamber 13 has one or more substrate transfer robots. Here, the atmosphere in the substrate processing chamber 15 can be controlled to be the one containing almost no hydrogen (e.g., an inert atmosphere, a reduced-pressure atmosphere, or a dry air atmosphere); for example, a dry nitrogen atmosphere having a dew point of lower than or equal to −40° C., preferably lower than or equal to −50° C., is possible. Here, the substrate processing chamber 15 preferably also serves as a substrate heating chamber and a plasma treatment chamber. With a single wafer multi-chamber film formation apparatus, a substrate does not need to be exposed to air between treatments, and adsorption of hydrogen to a substrate can be suppressed. In addition, the order of film formation, heat treatment, or the like can be freely created. Note that the numbers of the film formation chambers, the load lock chambers, and the substrate processing chambers are not limited to the above numbers, and can be determined as appropriate depending on the space for placement or the process.

First, as shown in a step S501 in FIG. 1, a substrate 100 is put on the cassette port 14 in the substrate supply chamber 11.

Next, as shown in a step S502 in FIG. 1, a gate valve of the load lock chamber 12a set to an atmospheric pressure state is opened, the substrate 100 is transferred from the cassette port 14 to the load lock chamber 12a with a first transfer robot, and then the gate valve is closed.

The load lock chamber 12a is evacuated and set to a vacuum state after the substrate 100 is introduced into the load lock chamber 12a. As shown in a step S503 in FIG. 1, a gate valve between the load lock chamber 12a in the vacuum state and the transfer chamber 13 in a vacuum state is opened, the substrate 100 is transferred to the transfer chamber 13 with a second transfer robot, and then the gate valve is closed.

After the substrate 100 is introduced into the transfer chamber 13, as shown in a step S504 in FIG. 1, a gate valve between the transfer chamber 13 and the substrate processing chamber 15 in a vacuum state is opened, the substrate 100 is transferred to the substrate processing chamber 15 with the second robot, and then the gate valve is closed.

Figure 2A:
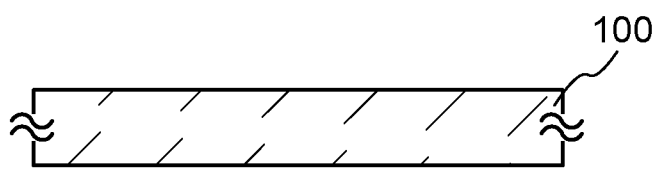
FIGS. 2A to 2D are cross-sectional views showing an example of a process of manufacturing a semiconductor device that is one embodiment of the present invention.

After the substrate 100 is introduced into the substrate processing chamber 15, the substrate 100 is subjected to heat treatment or plasma treatment (see FIG. 2A). By subjecting the substrate 100 to the heat treatment or the plasma treatment, the substrate 100 can be dehydrated or dehydrogenated. The heat treatment or the plasma treatment is performed at a temperature higher than or equal to 300° C. and lower than the strain point of the substrate, preferably higher than or equal to 400° C. and lower than or equal to 550° C. in an inert atmosphere, a reduced-pressure atmosphere, or a dry air atmosphere. A resistance heating method or the like may be used for the heating. Alternatively, rapid thermal anneal (RTA) treatment, such as gas rapid thermal anneal (GRTA) treatment or lamp rapid thermal anneal (LRTA) treatment, can be used. The LRTA treatment is treatment for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas is used. When heat treatment is performed in a short time using RTA, it is possible not to warp the substrate even at a temperature higher than or equal to the strain point of the substrate, so that the substrate can be dehydrated and dehydrogenated efficiently. For example, the substrate temperature may be higher than or equal to 500° C. and lower than or equal to 650° C. and the treatment time may be higher than or equal to 1 minute and less than or equal to 10 minutes. By plasma treatment, hydrogen absorbed on a surface of the substrate can be removed with plasma generated in an atmosphere of a rare gas, oxygen, nitrogen, or the like. Further, by plasma treatment, hydrogen which is strongly bonded to the substrate 100 can be removed efficiently. For example, argon plasma treatment may be performed by a reverse sputtering method.

After the dehydration or the dehydrogenation of the substrate 100, as shown in a step S505 in FIG. 1, the gate valve between the transfer chamber 13 and the substrate processing chamber 15 is opened, the substrate 100 is transferred to the transfer chamber 13 with the second transfer robot, and then the gate valve is closed.

After the substrate 100 is introduced into the transfer chamber 13, a gate valve between the transfer chamber 13 and the film formation chamber 10c in a vacuum state is opened, as shown in a step S506 in FIG. 1, the substrate 100 is transferred to the film formation chamber 10c with the second transfer robot, and then the gate valve is closed.

Figure 2B:
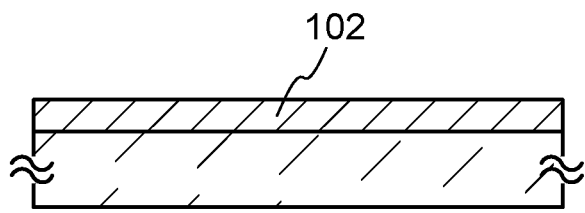

After the substrate 100 is introduced into the film formation chamber 10c, a base insulating film 102 is formed to have a thickness of greater than or equal to 100 nm and less than or equal to 500 nm over the substrate 100 (see FIG. 2B). The base insulating film 102 is formed by a film formation method such as a sputtering method, a molecular beam epitaxy (MBE) method, a CVD method, a pulse laser deposition method, or an atomic layer deposition (ALD) method.

A single layer or a stacked layer of silicon oxide, silicon oxynitride, silicon nitride, silicon nitride oxide, gallium oxide, gallium aluminum oxide ($Ga_xAl_{2-x}O_{3+y}$, (x is greater than or equal to 0 and less than or equal to 2, and y is greater than 0 and less than 1)), aluminum oxide, aluminum oxynitride, aluminum nitride oxide, aluminum nitride, or the like is used for a material of the base insulating film 102. For example, the base insulating film 102 has a layered structure of a silicon nitride film and a silicon oxide film, so that entry of moisture into a transistor 150 from the substrate or the like can be prevented. When the base insulating film 102 is formed to have a layered structure, a film which is in contact with an oxide semiconductor film 106 formed later may be an insulating film (e.g., silicon oxide, silicon oxynitride, or aluminum oxide) from which oxygen is released by heating. Thus, oxygen is supplied from the base insulating film 102 to the oxide semiconductor film 106, so that oxygen deficiency in the semiconductor film 106 and the interface state between the base insulating film 102 and the oxide semiconductor film 106 can be reduced. The oxygen deficiency of the oxide semiconductor film 106 causes the threshold voltage to shift in the negative direction, and the interface state between the base insulating film 102 and the oxide semiconductor film 106 reduces the reliability of the transistor.

Note that here, silicon oxynitride refers to silicon that includes more oxygen than nitrogen. In the case where measurements are performed using Rutherford backscattering spectrometry (RBS) and hydrogen forward scattering spectrometry (HFS), silicon oxynitride includes oxygen, nitrogen, and silicon at concentrations ranging from 50 at. % to 70 at. %, 0.5 at. % to 15 at. %, and 25 at. % to 35 at. % respectively. Further, silicon nitride oxide means silicon that includes more nitrogen than oxygen. In the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. % respectively. Note that percentages of nitrogen, oxygen, silicon, and hydrogen fall within the ranges given above, where the total number of atoms contained in the silicon oxynitride film or the silicon nitride oxide film is defined as 100 at. %.

Aluminum oxynitride refers to a substance that contains more oxygen than nitrogen. Further, aluminum nitride oxide refers to a substance that contains more nitrogen than oxygen.

The "insulating film that releases oxygen by heating" refers to an insulating film from which the amount of released oxygen is greater than or equal to $1.0\times10^{18}$ atoms/cm$^3$, preferably greater than or equal to $1.0\times10^{20}$ atoms/cm$^3$, further preferably greater than or equal to $3.0\times10^{20}$ atoms/cm$^3$ when converted into oxygen atoms by thermal desorption spectroscopy (TDS) analysis.

Here, a method in which the amount of released oxygen is measured by being converted into oxygen atoms using TDS analysis will be described.

The amount of released gas in TDS analysis is proportional to the integral value of a spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to an equation 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha \quad \text{(Equation 1)}$$

$N_{H2}$ is a value obtained by conversion of the number of hydrogen molecules desorbed from the standard sample into density. $S_{H2}$ is an integral value of spectrum of a standard sample which is analyzed by TDS. Here, the reference value of the standard sample is set to $N_{H2}/S_{H2}$. $S_{O2}$ is the integral value of a spectrum when the insulating film is subjected to TDS analysis. $\alpha$ is a coefficient which influences spectrum intensity in TDS analysis. Refer to Japanese Published Patent Application No. H6-275697 for details of the Equation 1. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen when converted into oxygen atoms is twice the number of the released oxygen molecules.

In the above structure, the insulating film that releases oxygen by heating may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

In the case where a mixed gas of oxygen and a rare gas is used as a film formation gas when the insulating layer from which oxygen is released by heating is formed by a sputtering method, the ratio of oxygen to the rare gas is preferably high. For example, the oxygen concentration in the whole gas may be greater than or equal to 6% and less than or equal to 100%. An oxide target is preferably used.

After the base insulating film 102 is formed over the substrate 100, as shown in a step S507 in FIG. 1, the gate valve between the transfer chamber 13 and the film formation chamber 10c is opened, the substrate 100 is transferred to the transfer chamber 13 with the second transfer robot, and then the gate valve is closed.

Although not shown, then, the gate valve between the transfer chamber 13 and the substrate processing chamber 15 in the vacuum state is opened, the substrate 100 is transferred to the substrate processing chamber 15 with the second transfer robot, the gate valve is closed, and then the substrate 100 may be subjected to heat treatment. The heat treatment is performed at a temperature of higher than or equal to 150° C. and lower than or equal to 280° C., preferably higher than or equal to 200° C. and lower than or equal to 250° C. in an inert atmosphere, a reduced-pressure atmosphere, or a dry air atmosphere. Through the above, hydrogen can be removed from the substrate 100 and the base insulating film 102. Note that the temperature at which hydrogen is removed from the base insulating film 102 but oxygen is released as little as possible is preferable. After the substrate 100 is subjected to the heat treatment, the gate valve between the transfer chamber 13 and the substrate processing chamber 15 is opened, the substrate 100 is transferred to the transfer chamber 13 with the second transfer robot, and then the gate valve is closed.

After the substrate 100 is introduced into the transfer chamber 13, a gate valve between the transfer chamber 13 and the film formation chamber 10a in a vacuum state is opened, as shown in a step S508 in FIG. 1, the substrate 100 is transferred to the film formation chamber 10a with the second transfer robot, and then the gate valve is closed.

Figure 2C:
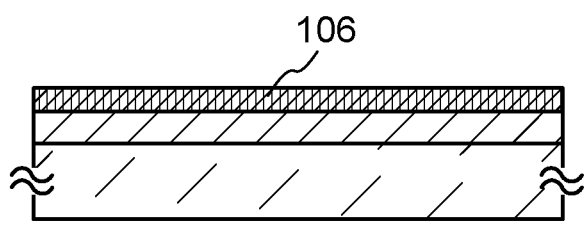

After the substrate 100 is introduced into the film formation chamber 10a, the oxide semiconductor film 106 is formed to have a thickness of greater than or equal to 3 nm and less than or equal to 50 nm over the base insulating film 102 (see FIG. 2C). The oxide semiconductor film 106 is formed by a film formation method such as a sputtering method, a MBE method, a CVD method, a pulse laser deposition method, or an ALD method.

As a material used for the oxide semiconductor film 106, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. In addition, any of the above materials may contain silicon oxide. Here, for example, an In—Ga—Zn—O-based material means an oxide including indium (In), gallium (Ga), and zinc (Zn), and there is no particular limitation on the composition ratio. Further, the In—Ga—Zn—O-based material may contain an element other than In, Ga, and Zn.

As the oxide semiconductor film 106, a thin film using a material represented by the chemical formula, $InMO_3(ZnO)_m$ (m>0), may be formed. Here, M represents one or more metal elements selected from Ga, Al, Mn, and Co. For example, M may be Ga, Ga and Al, Ga and Mn, Ga and Co, or the like.

An alkali metal and an alkaline earth metal are adverse impurities for an oxide semiconductor and are preferably contained little. The concentration of Na is less than or equal to $5 \times 10^{16}$ cm$^{-3}$, preferably less than or equal to $1 \times 10^{16}$ cm$^{-3}$, more preferably less than or equal to $1 \times 10^{15}$ cm$^{-3}$. The concentration of Li is less than or equal to $5 \times 10^{15}$ cm$^{-3}$, preferably less than or equal to $1 \times 10^{15}$ cm$^{-3}$. The concentration of K is less than or equal to $5 \times 10^{15}$ cm$^{-3}$, preferably less than or equal to $1\times10^{15}$ cm$^3$. An alkali metal, in particular, sodium diffuses into an insulating film and becomes Na$^+$ when an insulating film in contact with the oxide semiconductor is an oxide. In addition, sodium cuts the bond between a metal and oxygen or enters the bond in the oxide semiconductor. As a result, deterioration of transistor characteristics (e.g., the shift of a threshold voltage to the negative side (causing the transistor to be normally on) or a decrease in field-effect mobility) is caused. In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is less than or equal to $5\times10^{19}$ cm$^{-3}$, particularly less than or equal to $5\times10^{18}$ cm$^{-3}$.

In this embodiment, the oxide semiconductor film is formed by a sputtering method using an In—Ga—Zn—O-based oxide target.

As the In—Ga—Zn—O-based oxide target, for example, an oxide target having a composition ratio of $In_2O_3$:$Ga_2O_3$:ZnO=1:1:1 [molar ratio] can be used. Note that it is not necessary to limit the material and the composition ratio of the target to the above. For example, an oxide target having a composition ratio of $In_2O_3$:$Ga_2O_3$:ZnO=1:1:2 [molar ratio] can be used.

The relative density of the oxide target is greater than or equal to 90% and less than or equal to 100%, preferably greater than or equal to 95% and less than or equal to 99.9%. This is because, with the use of the oxide target with a high relative density, the formed oxide semiconductor film can be a dense film.

For example, the oxide semiconductor film can be formed as follows. However, the present invention is not limited to the following method.

An example of the film formation conditions is as follows: the distance between the substrate and the target is 60 mm; the pressure is 0.4 Pa; the direct-current (DC) power is 0.5 kW; and the film formation atmosphere is a mixed atmosphere containing argon and oxygen (the flow rate of the oxygen is 33%). Note that a pulse direct current (DC) sputtering method is preferably used because powder substances (also referred to as particles or dust) generated in film formation can be reduced and the film thickness can be uniform.

After the oxide semiconductor film 106 is formed over the substrate 100, as shown in a step S509 in FIG. 1, a gate valve between the transfer chamber 13 and the film formation chamber 10*a* is opened, the substrate 100 is transferred to the transfer chamber 13 with the second transfer robot, and then the gate valve is closed.

After the substrate 100 is introduced into the transfer chamber 13, the gate valve between the transfer chamber 13 and the substrate processing chamber 15 in a vacuum state is opened, as shown in a step S510 in FIG. 1, the substrate 100 is transferred to the substrate processing chamber 15 with the second transfer robot, and then the gate valve is closed.

After the substrate 100 is introduced into the substrate processing chamber 15, the substrate 100 is subjected to heat treatment or plasma treatment. The oxide semiconductor film 106 can be dehydrated or dehydrogenated by the heat treatment or the plasma treatment. The heat treatment or the plasma treatment is performed at temperature higher than or equal to 150° C. and lower than the strain point of the substrate, preferably higher than or equal to 250° C. and lower than or equal to 470° C. in an oxidizing atmosphere, an inert atmosphere, a reduced-pressure atmosphere, or a dry air atmosphere. At this time, oxygen may be supplied to the oxide semiconductor film 106 from the base insulating film 102 while hydrogen is removed from the oxide semiconductor film 106. Note that the heat treatment is preferably performed at a temperature higher than the temperature of the heat treatment performed between the steps S507 and S508 in FIG. 1 by 5° C. or higher. By performing the heat treatment in such a temperature range, oxygen can be supplied from the base insulating film 102 to the oxide semiconductor film 106 efficiently.

Note that an oxidizing atmosphere refers to an atmosphere containing an oxidation gas. Oxidation gas is oxygen, ozone, nitrous oxide, or the like, and it is preferable that the oxidation gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). As the oxidation gas atmosphere, an atmosphere in which an oxidation gas is mixed with an inert gas may be used, and the oxidation gas is contained at least at 10 ppm in the atmosphere.

After the oxide semiconductor film 106 is subjected to dehydration treatment or dehydrogenation treatment, as shown in a step S511 in FIG. 1, the gate valve between the transfer chamber 13 and the substrate processing chamber 15 is opened, the substrate 100 is transferred to the transfer chamber 13 with the second transfer robot, and then the gate valve is closed.

After the substrate 100 is introduced into the transfer chamber 13, as shown in a step S512 in FIG. 1, a gate valve between the transfer chamber 13 and the film formation chamber 10*b* in a vacuum state is opened, the substrate 100 is transferred to the film formation chamber 10*b* with the second transfer robot, and then the gate valve is closed.

Figure 2D:
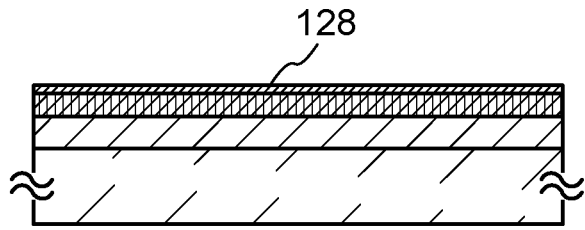

After the substrate 100 is introduced into the film formation chamber 10*b*, an oxide conductive film 128 is formed over the oxide semiconductor film 106 to have a thickness of greater than or equal to 3 nm and less than or equal to 30 nm (see FIG. 2D). The oxide conductive film 128 is formed by a film formation method such as a sputtering method, a MBE method, a CVD method, a pulse laser deposition method, or an ALD method.

By the provision of the oxide conductive film between the oxide semiconductor film 106 and a source electrode 108*a* formed later and between the oxide semiconductor film 106 and a drain electrode 108*b* formed later, it is possible to reduce the contact resistance between a source region and the oxide semiconductor film 106 and between a drain region and the oxide semiconductor film 106, so that the transistor can operate at high speed.

As the oxide conductive film, indium oxide ($In_2O_3$), tin oxide ($SnO_2$), zinc oxide (ZnO), indium tin oxide ($In_2O_3$—$SnO_2$; abbreviated to ITO), indium zinc oxide ($In_2O_3$—ZnO), or any of these metal oxide materials in which silicon oxide is contained can be used.

Alternatively, the oxide conductive film may be formed by injection of nitrogen into the oxide semiconductor film 106. Alternatively, the oxide conductive film may be formed with the use of a material similar to that of the oxide semiconductor film 106 as a target by a sputtering method in which nitrogen is included in a film formation gas.

Note that all of the steps are not necessarily undergone in the path of the substrate shown in FIG. 1. For example, one or more of the steps S504, S510, and S512 in FIG. 1 may be omitted. In that case, following steps may be changed as appropriate.

The above steps are performed without exposure to the air.

Although not shown in the flow of FIG. 1, after the oxide conductive film 128 is formed, the substrate 100 is returned to the cassette port 14 in the substrate supply chamber 11 through the transfer chamber 13 and the load lock chamber 12b.

Next, the following process of manufacturing the transistor is described with reference to FIGS. 4A to 4D.

Figure 4A:
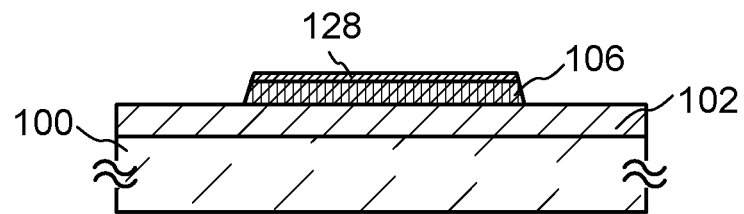
FIGS. 4A to 4D are cross-sectional views showing an example of a manufacturing process of a semiconductor device that is one embodiment of the present invention.

In FIG. 2D, a resist mask is formed over the oxide conductive film 128 through a photolithography step, the oxide semiconductor film 106 and the oxide conductive film 128 are each processed to have an island shape, and then the resist mask is removed (see FIG. 4A).

Next, a conductive film covering the island-shaped oxide semiconductor film 106 and the island-shaped oxide conductive film 128 is formed to have a thickness of greater than or equal to 15 nm and less than or equal to 700 nm. A resist mask is formed through a photolithography step and the conductive film is processed to form the source electrode 108a and the drain electrode 108b. At the same time, the oxide conductive film 128 is processed, and the resist mask is removed (see FIG. 4B). Although not shown, when the oxide conductive film 128 is processed, part of the oxide semiconductor film 106 is etched in a region between the source electrode 108a and the drain electrode 108b in some cases. In that case, processing conditions are preferably set so that the oxide semiconductor film 106 is not removed in the region between the source electrode 108a and the drain electrode 108b.

As the conductive film serving as the source electrode 108a and the drain electrode 108b, for example, a metal film containing an element selected from Al, Cr, Cu, Ta, Ti, Mo, and W or a metal nitride film containing any of the above elements as the main component (e.g., a titanium nitride film, a molybdenum nitride film, or a tungsten nitride film) can be used. A structure may be used in which a film of high-melting-point metal, such as Ti, Mo, or W, or a metal nitride film of any of these elements (e.g., a titanium nitride film, a molybdenum nitride film, or a tungsten nitride film) is stacked on one or both of a lower side and an upper side of a metal film of Al, Cu, or the like. Note that the conductive film serving as the source electrode 108a and the drain electrode 108b may be formed by using the multi-chamber film formation apparatus shown in FIG. 3.

The conductive film may be processed by etching with the use of a resist mask. Ultraviolet, a KrF laser light, an ArF laser light, or the like is preferably used for light exposure for forming a resist mask for the etching.

In the case where light exposure is performed so that the channel length L is less than 25 nm, the light exposure at the time of forming the resist mask is preferably performed using, for example, extreme ultraviolet having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

Etching may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. For this reason, a resist mask corresponding to at least two kinds of different patterns can be formed by using one multi-tone mask. That is, the steps can be simplified.

Figure 4B:
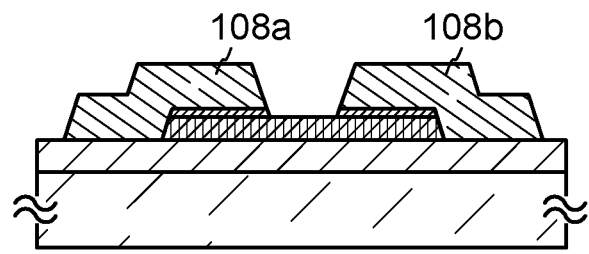
Figure 4C:
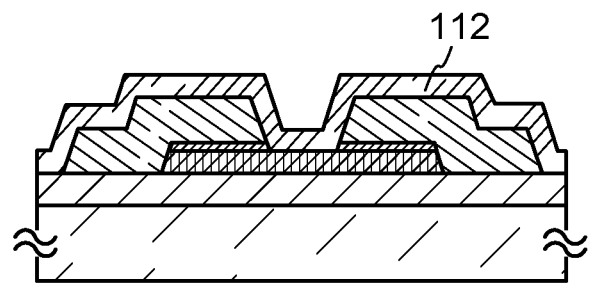
Figure 4D:
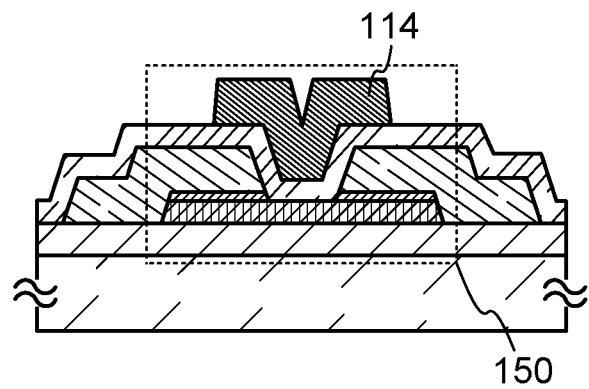

Next, a gate insulating film 112 part of which is in contact with the base insulating film 102, the oxide semiconductor film 106, and the oxide conductive film 128 and which covers the source electrode 108a and the drain electrode 108b is formed (see FIG. 4C).

Note that plasma treatment using an oxidation gas may be performed just before the formation of the gate insulating film 112 so that an exposed surface of the oxide semiconductor film 106 is oxidized and oxygen deficiency is filled. When performed, the plasma treatment preferably follows the formation of the gate insulating film 112 which is to be in contact with part of the oxide semiconductor film 106 without exposure to the air. The gate insulating film 112 may be formed by using the multi-chamber film formation apparatus shown in FIG. 3.

The gate insulating film 112 can have a structure similar to that of the base insulating film 102, and is preferably an insulating film from which oxygen is released by heating. At this time, a material having a high dielectric constant, such as yttrium oxide, zirconium oxide, hafnium oxide, or aluminum oxide may be used for the gate insulating film 112 in consideration of the function of the gate insulating film of the transistor. Alternatively, a stacked layer of silicon oxide, silicon oxynitride, or silicon nitride and a material having a high dielectric constant, such as yttrium oxide, zirconium oxide, hafnium oxide, or aluminum oxide, may be used in consideration of the gate withstand voltage and the condition of the interface between the oxide semiconductor film and the gate insulating film 112, or the like. The total thickness of the gate insulating film 112 is preferably greater than or equal to 1 nm and less than or equal to 300 nm, more preferably greater than or equal to 5 nm and less than or equal to 50 nm. As the thickness of the gate insulating film is larger, a short channel effect is enhanced more and the threshold voltage tends to easily shift in the negative direction. In addition, leakage due to a tunnel current is found to be increased with a thickness of the gate insulating film of less than or equal to 5 nm.

Next, a conductive film is formed. The conductive film is processed with the use of a resist mask formed through a photolithography step, so that a gate electrode 114 is formed, and then the resist mask is removed (see FIG. 4D). The gate electrode 114 can be formed using a metal material such as molybdenum, titanium, tantalum, tungsten, aluminum, copper, neodymium, or scandium, nitride of any of these metal materials, or an alloy material which contains any of these metal materials as its main component. Note that the gate electrode 114 may have a single-layer structure or a layered structure. When a material containing Al is used for the conductive film, the highest process temperature in the following steps is preferably lower than or equal to 380° C., more preferably lower than or equal to 350° C. When Cu is used for the conductive film, a metal material with a higher melting point than the melting point of Cu, such as Mo, Ti, or W, is preferably stacked in order to prevent defects caused by migration or diffusion of Cu elements. Further, when a material containing Cu is used for the conductive film, the highest process temperature in the following steps is preferably lower than or equal to 450° C. The conductive film serving as the gate electrode 114 may be formed by using the multi-chamber film formation apparatus shown in FIG. 3.

Note that the steps from the plasma treatment performed on the oxide semiconductor film 106 to the formation of the conductive film serving as the gate electrode 114 are preferably performed without exposure to the air. More preferably, the multi-chamber film formation apparatus shown in FIG. 3 is used. Without exposure to the air, hydrogen in the film and the interface between the films can be removed.

Through the above steps, the transistor 150 is manufactured.

Figure 5A:
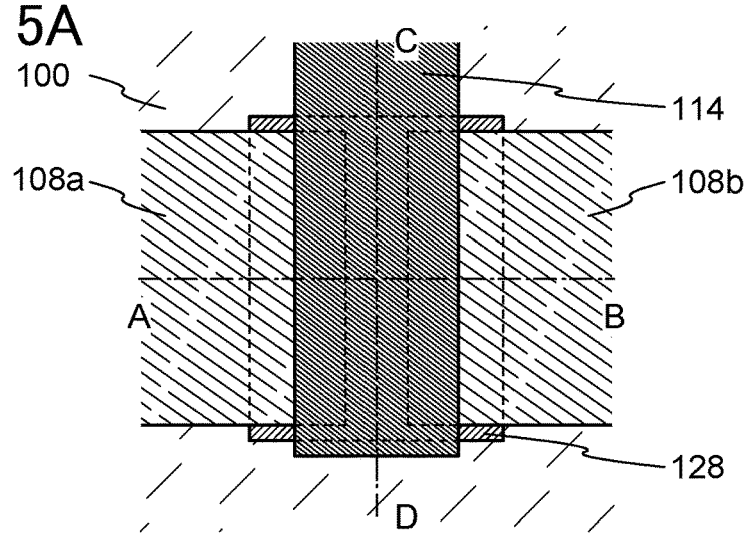
FIGS. 5A to 5C are a top view and cross-sectional views showing an example of a semiconductor device that is one embodiment of the present invention.
Figure 5B:
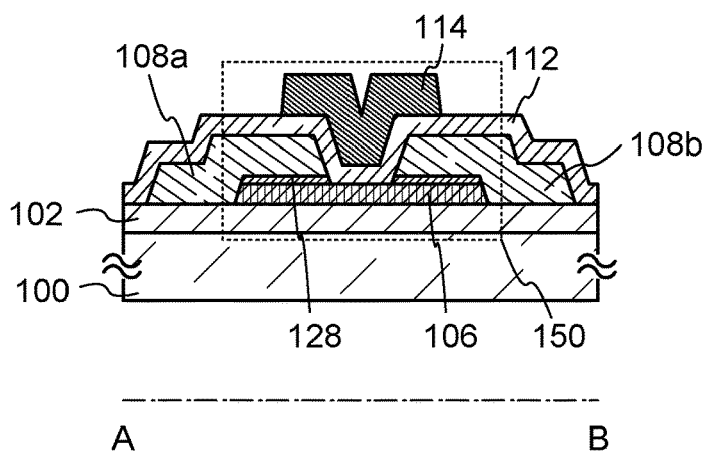
Figure 5C:
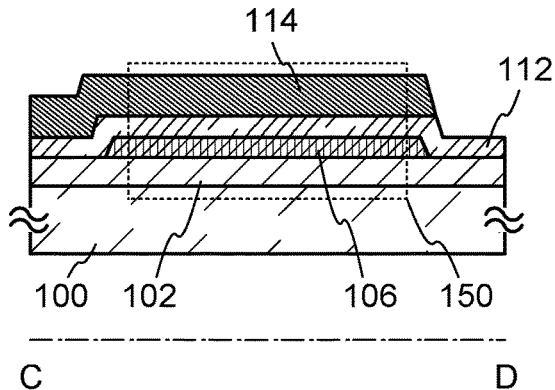

FIGS. 5A to 5C show a top view and cross-sectional views of the transistor 150.

FIG. 5B is a cross sectional view along A-B of FIG. 5A. FIG. 5C is a cross-sectional view along C-D of FIG. 5A. Note that in FIG. 5A, some of the components of the transistor 150 (e.g., the gate insulating film 112) are omitted for brevity.

According to this embodiment, hydrogen in the film and the interface between the films can be removed, so that a transistor with less variation in the threshold voltage and stable electrical characteristics is provided. Further, hydrogen in a film in contact with an oxide semiconductor film can be reduced, whereby entry of hydrogen into the oxide semiconductor film can be suppressed. Thus, a semiconductor device having a transistor with favorable electrical characteristics and high reliability is provided.

Further, the number of apparatuses needed for manufacture of a transistor can be reduced with the use of a multi-chamber film formation apparatus.

Embodiment 2

In this embodiment, description is made on a method for manufacturing a bottom-gate top-contact transistor using an oxide semiconductor with less entry of hydrogen into a film and an interface between films.

Figure 7A:
FIGS. 7A to 7C are cross-sectional views showing an example of a process of manufacturing a semiconductor device that is one embodiment of the present invention.
Figure 7B:
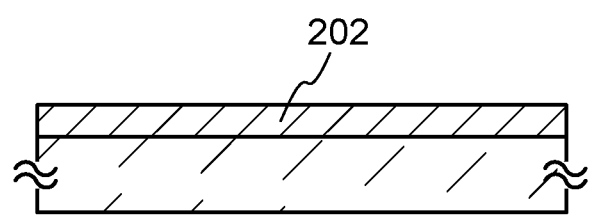
Figure 7C:
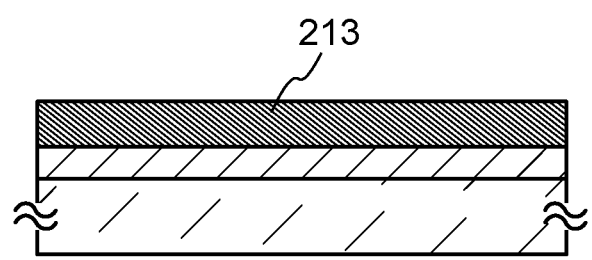

FIG. 6 is a flow chart showing a path of a substrate in a multi-chamber film formation apparatus. FIGS. 7A to 7C are cross-sectional views corresponding to a manufacturing flow in FIG. 6. A multi-chamber film formation apparatus similar to that in Embodiment 1 is used.

First, as shown in a step S601 in FIG. 6, a substrate 200 is put on the cassette port 14 in the substrate supply chamber 11.

Next, as shown in a step S602 in FIG. 6, the gate valve of the load lock chamber 12a set to an atmospheric pressure state is opened, the substrate 200 is transferred from the cassette port 14 to the load lock chamber 12a with the first transfer robot, and then the gate valve is closed.

The load lock chamber 12a is evacuated and set to a vacuum state after the substrate 200 is introduced into the load lock chamber 12a. As shown in a step S603 in FIG. 6, the gate valve between the load lock chamber 12a in the vacuum state and the transfer chamber 13 in a vacuum state is opened, the substrate 200 is transferred to the transfer chamber 13 with the second transfer robot, and then the gate valve is closed.

After the substrate 200 is introduced into the transfer chamber 13, as shown in a step S604 in FIG. 6, the gate valve between the transfer chamber 13 and the substrate processing chamber 15 in a vacuum state is opened, the substrate 200 is transferred to the substrate processing chamber 15 with the second transfer robot, and then the gate valve is closed.

After the substrate 200 is introduced into the substrate processing chamber 15, the substrate 200 is subjected to heat treatment or plasma treatment (see FIG. 7A). The heat treatment and the plasma treatment may be performed in a manner similar to the manners in Embodiment 1.

After the substrate 200 is subjected to dehydration treatment or dehydrogenation treatment, as shown in a step S605 in FIG. 6, the gate valve between the transfer chamber 13 and the substrate processing chamber 15 is opened, the substrate 200 is transferred to the transfer chamber 13 with the second transfer robot, and then the gate valve is closed.

After the substrate 200 is introduced into the transfer chamber 13, as shown in a step S606 in FIG. 6, the gate valve between the transfer chamber 13 and the film formation chamber 10c in a vacuum state is opened, the substrate 200 is transferred to the film formation chamber 10c with the second transfer robot, and then the gate valve is closed.

After the substrate 200 is introduced into the film formation chamber 10c, a base insulating film 202 is formed over the substrate 200 (see FIG. 7B). The base insulating film 202 may have a structure similar to that of the base insulating film 102.

After the base insulating film 202 is formed over the substrate 200, as shown in a step S607 in FIG. 6, the gate valve between the transfer chamber 13 and the film formation chamber 10c is opened, the substrate 200 is transferred to the transfer chamber 13 with the second transfer robot, and then the gate valve is closed.

After the substrate 200 is introduced into the transfer chamber 13, as shown in a step S608 in FIG. 6, the gate valve between the transfer chamber 13 and the film formation chamber 10a in a vacuum state is opened, the substrate 200 is transferred to the film formation chamber 10a with the second transfer robot, and then the gate valve is closed.

After the substrate 200 is introduced into the film formation chamber 10a, a conductive film 213 is formed over the substrate 200 (see FIG. 7C). The conductive film 213 may have a structure similar to that of the conductive film serving as the gate electrode 114.

Note that all of the steps are not necessarily undergone in the path of the substrate shown in FIG. 6. For example, the step S604 in FIG. 6 may be omitted. In that case, following steps may be changed as appropriate.

The above steps are performed without exposure to the air.

Although not shown in the flow of FIG. 6, after the conductive film is formed, the substrate 200 is returned to the cassette port 14 in the substrate supply chamber 11 through the transfer chamber 13 and the load lock chamber 12b.

Alternatively, after the base insulating film 202 is formed, the substrate 200 is transferred to the substrate processing chamber 15, the substrate 200 is subjected to plasma treatment or heat treatment, the substrate 200 is transferred to the film formation chamber 10b through the transfer chamber 13, and then an insulating film may be formed. The insulating film may include a silicon nitride film, a silicon nitride oxide film, a gallium oxide film, a gallium aluminum oxide film, an aluminum oxide film, an aluminum oxynitride film, an aluminum nitride oxide film, or an aluminum nitride film. Then, the substrate 200 is transferred to the film formation chamber 10a through the transfer chamber 13 and the conductive film 213 is formed. Note that the above steps are performed without exposure to the air. Thus, hydrogen in the film and the interface between the films can be further removed.

Next, a process of manufacturing the transistor following the steps in FIGS. 7A to 7C is described with reference to FIGS. 8A to 8E and FIGS. 9A to 9C.

Figure 8A:
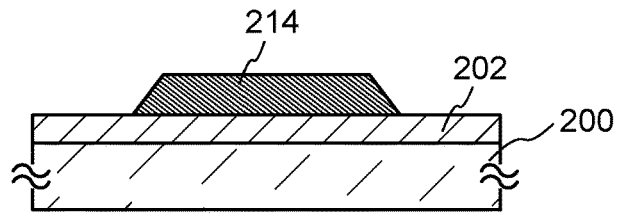
FIGS. 8A to 8E are cross-sectional views showing an example of a process of manufacturing a semiconductor device that is one embodiment of the present invention.

First, a resist mask is formed over the conductive film 213 through a photolithography step, the conductive film 213 is processed, and a gate electrode 214 is formed (see FIG. 8A).

Figure 8B:
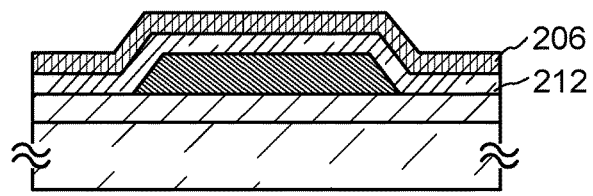

Next, a gate insulating film 212 part of which is in contact with the base insulating film 202 and which covers the gate electrode 214 is formed, and then an oxide semiconductor film 206 is formed over the gate insulating film 212 (see FIG. 8B). The gate insulating film 212 and the oxide semiconductor film 206 may have structures similar to those of the gate insulating film 112 and the oxide semiconductor film 106 respectively.

Next, the substrate 200 is subjected to heat treatment or plasma treatment. By subjecting the oxide semiconductor film 206 to the heat treatment or the plasma treatment, the oxide semiconductor film 206 can be dehydrated or dehydrogenated. The heat treatment or the plasma treatment is performed at a temperature higher than or equal to 150° C. and lower than the strain point of the substrate, preferably higher than or equal to 250° C. and lower than or equal to 470° C. in an oxidizing atmosphere, an inert atmosphere, a reduced-pressure atmosphere, or a dry air atmosphere. When an insulating film releasing oxygen is used as the gate insulating film 212, oxygen can be supplied from the gate insulating film 212 to the oxide semiconductor film 206 by the heat treatment.

Figure 8C:
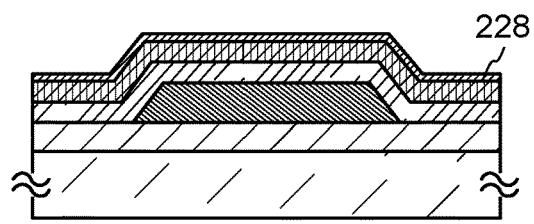

An oxide conductive film 228 is formed over the oxide semiconductor film 206 (see FIG. 8C). The oxide conductive film 228 may have a structure similar to that of the oxide conductive film 128. Note that the oxide conductive film 228 is not necessarily provided.

Here, the steps from the formation of the gate insulating film 212 to the formation of the oxide conductive film 228 are preferably performed without exposure to the air. Hydrogen in the film and the interface between the films can be removed and the electrical characteristics and the reliability of a transistor can be improved. Note that the multi-chamber film formation apparatus shown in FIG. 3 can be used for the steps from the formation of the gate insulating film 212 to the formation of the oxide conductive film 228.

Figure 8D:
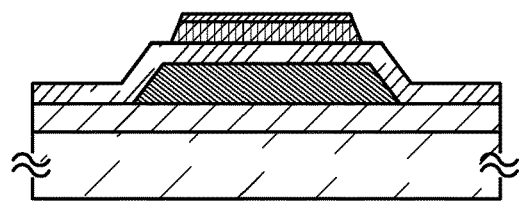
Figure 8E:
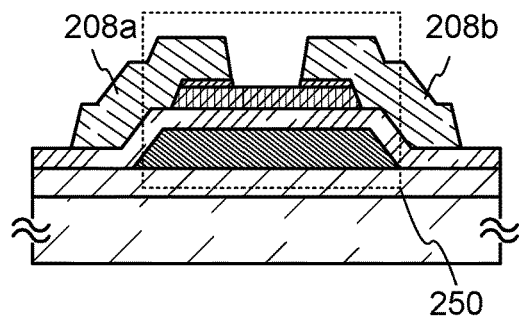

Next, a resist mask is formed over the oxide conductive film 228 through a photolithography step and the oxide conductive film 228 and the oxide semiconductor film 206 are each processed to have an island shape (see FIG. 8D).

Next, a conductive film covering the oxide conductive film 228, the oxide semiconductor film 206, and the gate insulating film 212 is formed, a resist mask is formed over the conductive film through a photolithography step, and the conductive film is processed to form a source electrode 208a and a drain electrode 208b. At the same time, part of the oxide conductive film 228 between the source electrode 208a and the drain electrode 208b is also processed, and the oxide conductive film 228 is provided so as to be in contact with a surface of the oxide semiconductor film 206 and be connected to part of the source and drain electrodes (see FIG. 8E). The source electrode 208a and the drain electrode 208b may have structures similar to those of the source electrode 108a and the drain electrode 108b.

Through the above steps, a bottom-gate top-contact transistor 250 can be manufactured.

Here, the source electrode 208a, the drain electrode 208b, the oxide conductive film 228, the oxide semiconductor film 206, and the gate insulating film 212 may be subjected to plasma treatment or heat treatment. For example, when a reverse sputtering treatment is performed, upper end portions of the source electrode 208a and the drain electrode 208b have curved surfaces, whereby field effect concentration at the time of operating the transistor can be relieved. Further, defects in the oxide semiconductor film 206 or in the vicinity of the surface of the oxide semiconductor film 206 are repaired by plasma treatment or heat treatment in an oxidizing atmosphere, so that oxygen deficiency can be reduced. The heat treatment may be performed at temperature higher than or equal to 200° C. and lower than or equal to 500° C.

Figure 9A:
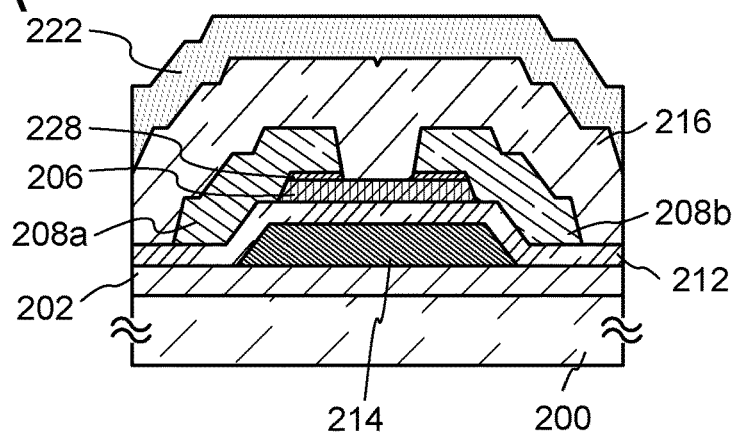
FIGS. 9A to 9C are cross-sectional views showing an example of a process of manufacturing a semiconductor device that is one embodiment of the present invention.

Next, an interlayer insulating film 216 part of which is in contact with the oxide conductive film 228, the oxide semiconductor film 206, and the gate insulating film 212 and which covers the source electrode 208a and the drain electrode 208b is formed, and then a conductive film 222 is formed over the interlayer insulating film 216 (see FIG. 9A). Note that the interlayer insulating film 216 may have a structure similar to that of the base insulating film 202. For example, part of the interlayer insulating film 216 is preferably a silicon nitride film, a silicon nitride oxide film, a gallium oxide film, a gallium aluminum oxide film, an aluminum oxide film, an aluminum oxynitride film, an aluminum nitride oxide film, or an aluminum nitride film because hydrogen entering from the outside can be reduced. For the conductive film 222, a material similar to that of the gate electrode 214 or the oxide conductive film 228 may be used. Note that after the interlayer insulating film 216 is formed, heat treatment may be performed at a temperature higher than or equal to 250° C. and lower than or equal to 350° C. in an oxidizing atmosphere, an inert atmosphere, a reduced-pressure atmosphere, or a dry air atmosphere. In the case where an insulating film releasing oxygen is used as the interlayer insulating film 216, oxygen can be supplied from the interlayer insulating film 216 to the oxide semiconductor film 206 by performing the heat treatment. Further, oxygen deficiency at the interface between the oxide semiconductor film 206 and the interlayer insulating film 216 or in the vicinity of the oxide semiconductor film 206 and the interlayer insulating film 216 is reduced by supplied oxygen. In addition, when the part of the interlayer insulating film 216 is a silicon nitride film, a silicon nitride oxide film, a gallium oxide film, a gallium aluminum oxide film, an aluminum oxide film, an aluminum oxynitride film, an aluminum nitride oxide film, or an aluminum nitride film, outward diffusion of the supplied oxygen can be prevented. In other words, new oxygen deficiency is less likely to be generated in the oxide semiconductor film 206 and in the vicinity thereof; thus, the transistor with favorable electrical characteristics and high reliability can be manufactured.

Here, the steps from the plasma treatment or the heat treatment on the source electrode 208a, the drain electrode 208b, the oxide conductive film 228, the oxide semiconductor film 206, and the gate insulating film 212 to the formation of the conductive film 222 may be performed without exposure to the air. Hydrogen in the film and the interface between the films can be removed and the electrical characteristics and the reliability of the transistor can be improved. Note that the multi-chamber film formation apparatus shown in FIG. 3 may be used.

Figure 9B:
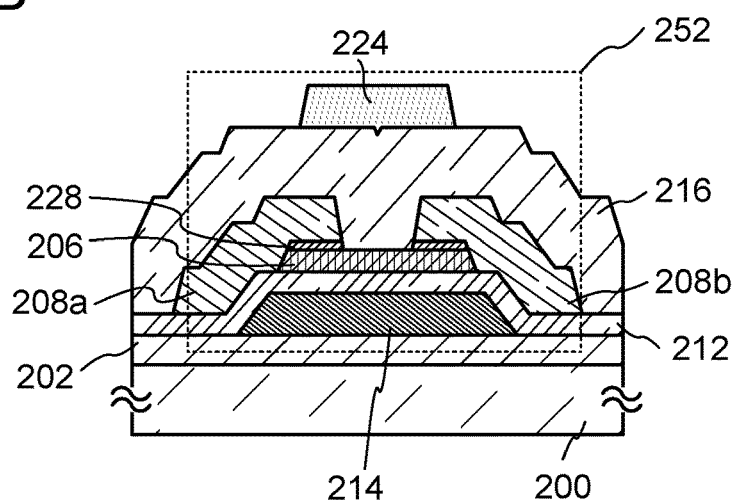

Next, a resist mask is formed over the conductive film 222 through a photolithography step, and the conductive film 222 is processed into a back gate electrode 224 (see FIG. 9B).

Through the above steps, a bottom-gate top-contact transistor 252 can be manufactured.

Figure 9C:
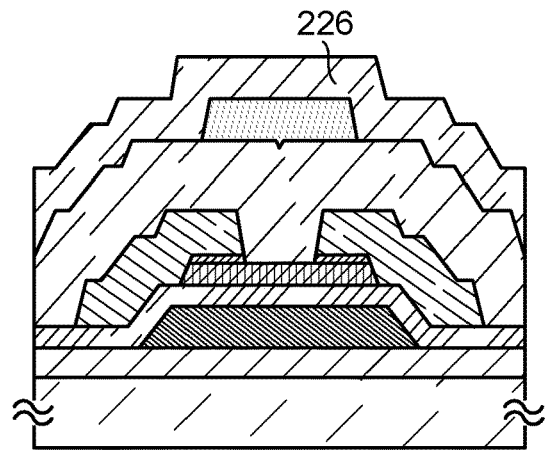

Next, a protective insulating film 226 covering the back gate electrode 224 and the interlayer insulating film 216 may be formed (see FIG. 9C). As the protective insulating film 226, a silicon nitride film, a silicon nitride oxide film, or an aluminum oxide film may be formed by a sputtering method or a CVD method. By the provision of the protective insulating film 226, entry of hydrogen from the outside into the transistor 252 can be suppressed.

According to this embodiment, hydrogen in the film and the interface between the films can be removed, so that a transistor with less variation in the threshold voltage and stable electrical characteristics is provided. Further, hydrogen in a film in contact with an oxide semiconductor film can be reduced, whereby entry of hydrogen into the oxide semiconductor film can be suppressed. Consequently, a semiconductor device having a transistor with favorable electrical characteristics and high reliability can be provided.

Further, the number of apparatuses needed for manufacture of a transistor can be reduced with the use of a multi-chamber film formation apparatus.

Embodiment 3

In this embodiment, description is made on a method for manufacturing a bottom-gate top-contact transistor using an oxide semiconductor with less entry of hydrogen into a film and an interface between films with reference to FIGS. 10A to 10E. The method is different from that in Embodiment 2. Note that steps up to and including those in the flow of FIG. 6 and FIGS. 7A to 7C are similar to those in Embodiment 2.

Figure 10A:
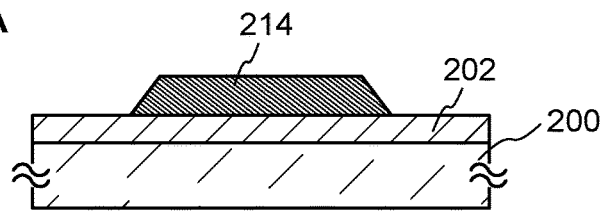
FIGS. 10A to 10E are cross-sectional views showing an example of a process of manufacturing a semiconductor device that is one embodiment of the present invention.
Figure 10B:
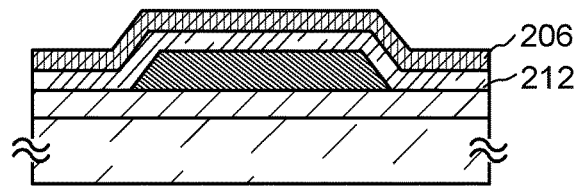

Manufacturing steps up to and including those in FIGS. 10A and 10B are similar to those in the manufacturing steps up to and including those in FIGS. 8A and 8B.

After the oxide semiconductor film 206 is formed, the substrate 200 is subjected to heat treatment or plasma treatment. By subjecting the oxide semiconductor film 206 to the heat treatment or the plasma treatment, the oxide semiconductor film 206 can be dehydrated or dehydrogenated. The heat treatment or the plasma treatment is performed at a temperature higher than or equal to 150° C. and lower than the strain point of the substrate, preferably higher than or equal to 250° C. and lower than or equal to 470° C. in an oxidizing atmosphere, an inert atmosphere, a reduced-pressure atmosphere, or a dry air atmosphere.

Figure 10C:
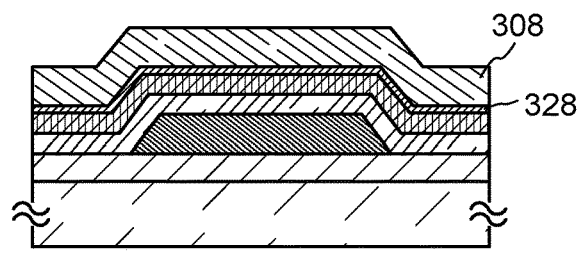

An oxide conductive film 328 and a conductive film 308 are formed over the oxide semiconductor film 206 (see FIG. 10C). The oxide conductive film 328 may have a structure similar to that of the oxide conductive film 128. Note that the oxide conductive film 328 is not necessarily provided. Further, the conductive film 308 is processed to form a source electrode 308a and a drain electrode 308b later. The conductive film 308 may have a structure similar to that of the conductive film serving as the source electrode 108a and the drain electrode 108b.

Here, the steps from the formation of the gate insulating film 212 to the formation of the conductive film 308 are preferably performed without exposure to the air. Note that the multi-chamber film formation apparatus shown in FIG. 3 can be used for the steps from the formation of the gate insulating film 212 to the formation of the conductive film 308.

Figure 10D:
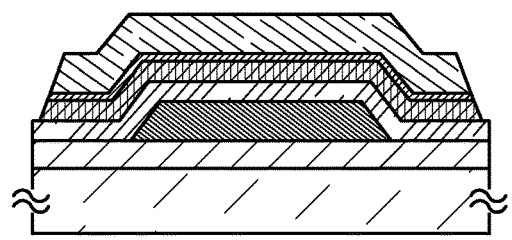
Figure 10E:
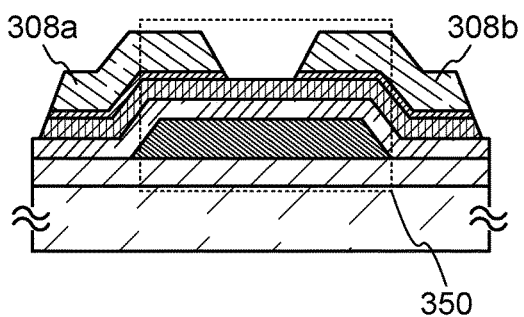

Next, a resist mask is formed over the conductive film 308 through a photolithography step and the conductive film 328 and the oxide semiconductor film 206 are each processed to have an island shape (see FIG. 10D).

Next, a resist covering the conductive film 308, the oxide conductive film 328, the oxide semiconductor film 206, and the substrate 200 is applied, a resist mask is formed through a photolithography step, and the conductive film 308 and the oxide conductive film 328 are processed to form the source electrode 308a and the drain electrode 308b. At this time, the oxide conductive film 328 is formed between the source electrode 308a and the oxide semiconductor film 206 and between the drain electrode 308b and the oxide semiconductor film 206 (see FIG. 10E). Although not shown, part of the oxide semiconductor film 206 between the source electrode 308a and the drain electrode 308b may be etched.

Through the above steps, a bottom-gate top-contact transistor 350 can be manufactured.

Following the above steps, an interlayer insulating film, a back gate electrode, and a protective insulating film may be formed in a manner similar to that of the transistor 252. Note that the oxide semiconductor film 206 exposed before the formation of an interlayer insulating film may be subjected to heat treatment at a temperature higher than or equal to 200° C. and lower than or equal to 500° C. in an oxidizing atmosphere, an inert atmosphere, a reduced-pressure atmosphere, or a dry air atmosphere. Then, the interlayer insulating film is formed without exposure to the air.

According to this embodiment, the steps from the formation of the gate insulating film 212 to the formation of the conductive film 308 can be performed without exposure to the air, hydrogen in the film and the interface between the films can be removed, so that the electrical characteristics and the reliability of the transistor can be further improved than those in Embodiment 2.

Further, the number of apparatuses needed for manufacture of a transistor can be reduced with the use of a multi-chamber film formation apparatus.

Embodiment 4

In this embodiment, a method for forming an insulating film releasing oxygen is described with reference to FIGS. 2A to 2D and FIG. 18.

Figure 18:
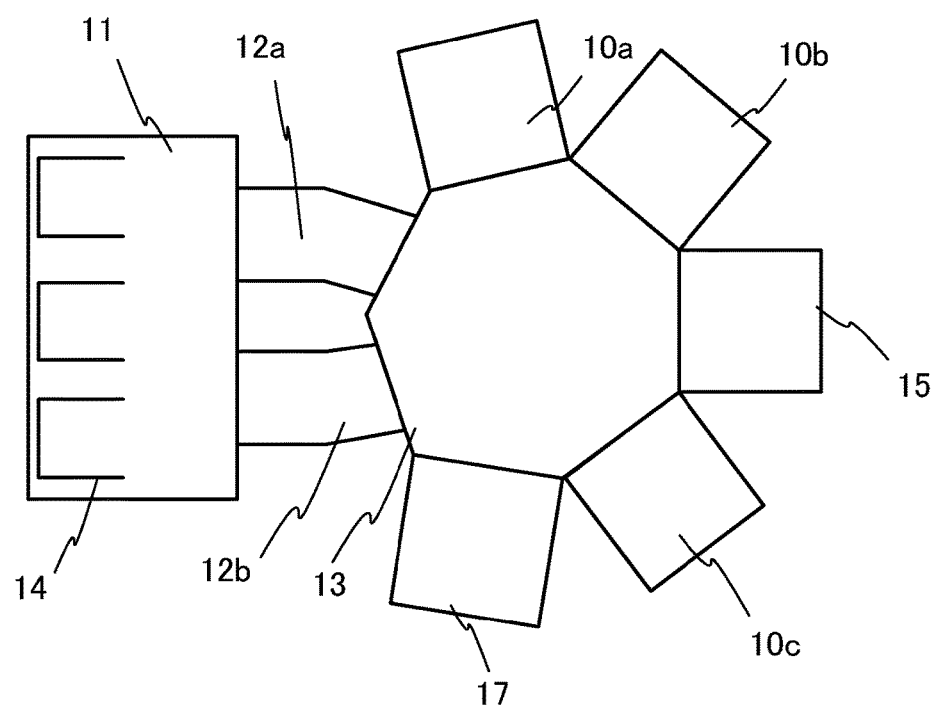
FIG. 18 is a top view showing an example of a film formation apparatus that is one embodiment of the present invention.

FIG. 18 shows a structure in which the film formation apparatus in FIG. 3 is provided with an ion implantation chamber 17.

In the ion implantation chamber 17, ion doping or ion implantation can be performed.

Note that, in this embodiment, film formation, ion implantation, and heat treatment or plasma treatment are performed successively in a vacuum state as much as possible. The method for forming an insulating film releasing oxygen by using the film formation apparatus in FIG. 18 is described below.

First, the substrate 100 is introduced into the load lock chamber 12a. Next, the substrate 100 is transferred to the substrate processing chamber 15, and hydrogen adsorbed to the substrate 100 is removed through first heat treatment, plasma treatment, or the like in the substrate processing chamber 15. Here, the first heat treatment is performed at temperature higher than or equal to 100° C. and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrous oxide) is used. Then, the substrate 100 is transferred to the film formation chamber 10a and the base insulating film 102 is formed by a sputtering method to have a thickness greater than or equal to 50 nm and less than or equal to 500 nm, preferably greater than or equal to 200 nm and less than or equal to 400 nm (see FIG. 2B). Then, oxygen whose mass number is 16 ($^{16}O$), oxygen whose mass number is 18 ($^{18}O$), or $^{16}O$ and $^{18}O$ are implanted to the base insulating film 102 by an ion doping method or an ion implantation method. At this time, when an ion doping method is used, hydrogen is also implanted to the base insulating film 102. For this reason, an ion implantation method is preferably used. Then, after the substrate 100 is transferred to the substrate processing chamber 15, second heat treatment may be performed at temperature higher than or equal to 150° C. and lower than or equal to 280° C., preferably higher than or equal to 200° C. and lower than or equal to 250° C. in an inert atmosphere, a reduced-pressure atmosphere, or a dry air atmosphere. Through the second heat treatment, hydrogen can be removed from the substrate 100 and the base insulating film 102. Note that the second heat treatment is performed at temperature at which hydrogen is removed from the base insulating film 102 but as less oxygen as possible is released. Next, the substrate 100 is transferred to the film formation chamber 10b and the oxide semiconductor film 106 is formed by a sputtering method (see FIG. 2C). Then, after the substrate 100 is transferred to the substrate processing chamber 15, third heat treatment may be performed at temperature greater than or equal to 250° C. and lower than or equal to 470° C. in an inert atmosphere, a reduced-pressure atmosphere, or a dry air atmosphere so that hydrogen is removed from the oxide semiconductor film while oxygen is supplied from the base insulating film 102 to the oxide semiconductor film. Note that the third heat treatment is performed at higher temperature than that of the second heat treatment by 5° C. or more. By use of the film formation apparatus in FIG. 18 in this manner, the manufacturing process can proceed with less entry of hydrogen during film formation.

Through the above, according to Embodiment 1 and the like, a semiconductor device using an oxide semiconductor with less variation in electrical characteristics can be provided. Further, a semiconductor device with high reliability can be provided.

The structures and methods described in this embodiment can be combined as appropriate with any of the structures and methods described in the other embodiments.

Embodiment 5

In this embodiment, a method for manufacturing a transistor which is used for a pixel in a liquid crystal display device and for which reduced number of photomasks and reduced number of photolithography steps are used is described with reference to FIG. 11, FIGS. 12A and 12B, and FIGS. 13A to 13F.

Figure 11:
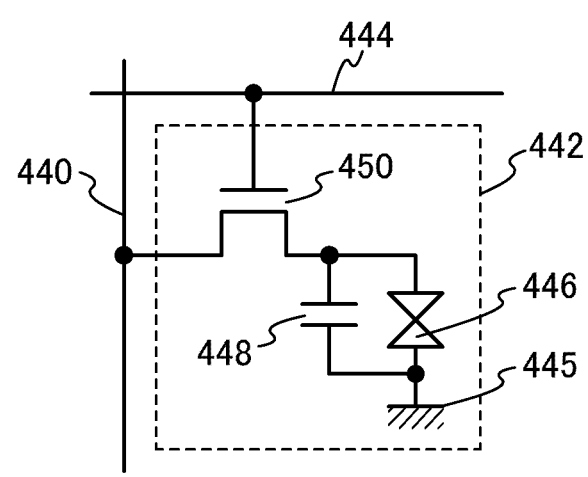
FIG. 11 is a circuit diagram showing an example of a pixel in a display device that is one embodiment of the present invention.

FIG. 11 shows a circuit configuration of a pixel 442. The pixel 442 includes a transistor 450, a liquid crystal element 446, and a capacitor 448. A gate electrode of the transistor 450 is electrically connected to a wiring 444 and one of a source electrode and a drain electrode of the transistor 450 is electrically connected to a wiring 440. The other of the source electrode and the drain electrode of the transistor 450 is electrically connected to one electrode of the liquid crystal element 446 and one electrode of the capacitor 448. The other electrode of the liquid crystal element 446 and the other electrode of the capacitor 448 are electrically connected to an electrode 445. The potential of the electrode 445 may be set to a fixed potential such as 0V, GND, or a common potential.

The transistor 450 has a function of selecting whether an image signal supplied from the wiring 440 is input to the liquid crystal element 446. When a signal for turning on the transistor 450 is supplied to the wiring 444, an image signal from the wiring 440 is supplied to the liquid crystal element 446 through the transistor 450. The light transmittance of the liquid crystal element 446 is controlled depending on a supplied image signal (potential). The capacitor 448 has a function of a storage capacitor (also referred to as a Cs capacitor) for storing a potential supplied to the liquid crystal element 446. The capacitor 448 is not necessarily provided. However, by provision of the capacitor 448, a change in the potential applied to the liquid crystal element 446 due to a current (off-state current) flowing between the source electrode and the drain electrode of the transistor 450 which is turned off can be suppressed.

An oxide semiconductor is used as a semiconductor where a channel of the transistor 450 is formed. In a transistor obtained by processing an oxide semiconductor with an energy gap of greater than or equal to 3.0 eV under appropriate conditions, the off-state current of the oxide semiconductor can be less than or equal to 100 zA ($1\times10^{-19}$ A/µm) or less than or equal to 10 zA ($1\times10^{-20}$ A/µm), preferably less than or equal to 1 zA ($1\times10^{-21}$ A/µm) at operating temperature (e.g., 25° C.). For this reason, the potential applied to the liquid crystal element 446 can be stored without provision of the capacitor 448. Further, a liquid crystal display device with low power consumption can be provided.

Figure 12A:
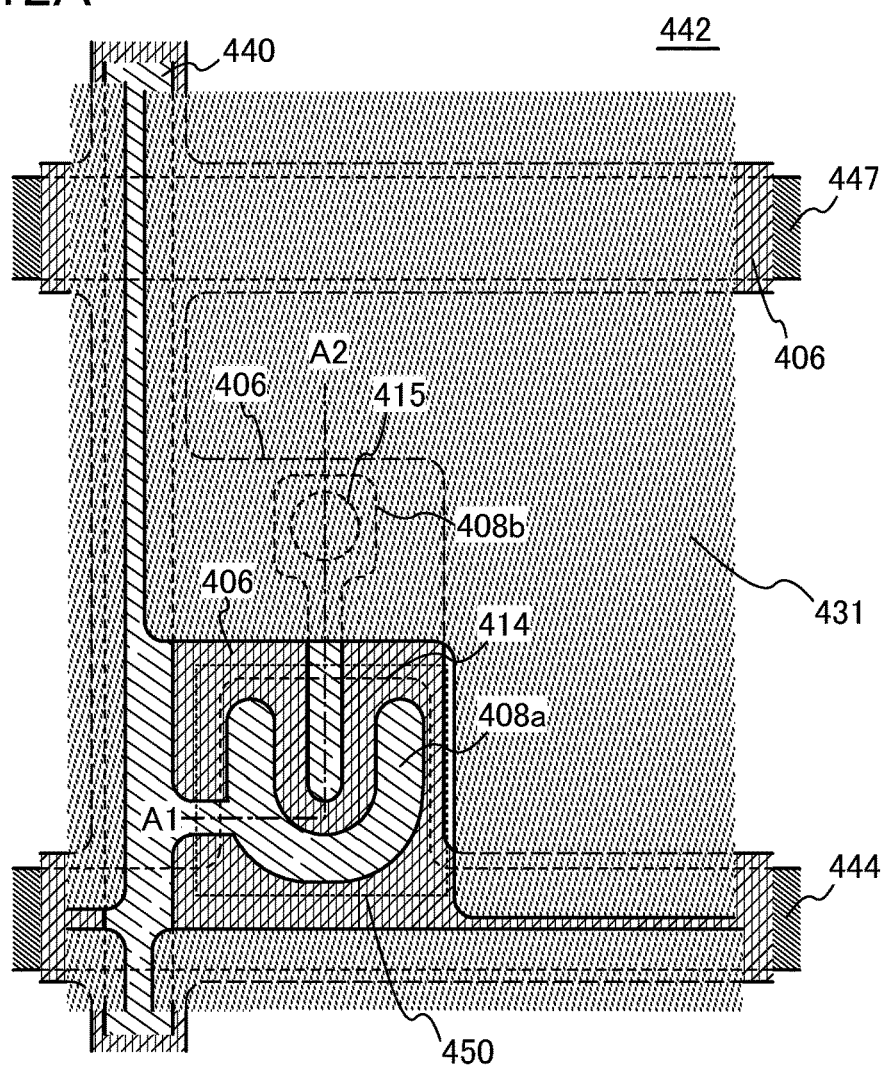
FIGS. 12A and 12B are a top view and a cross-sectional view showing an example of a pixel in a display device that is one embodiment of the present invention.
Figure 12B:
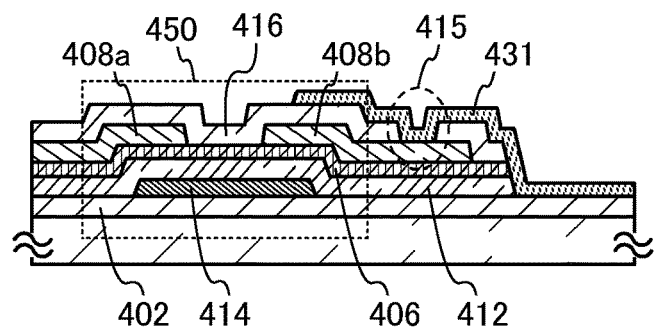

Next, an example of a structure of the pixel 442 shown in FIG. 11 is described with reference to FIGS. 12A and 12B. FIG. 12A is a top view showing a plan structure of the pixel 442, and FIG. 12B is a cross-sectional view showing a stacked structure of the transistor 450. Note that A1-A2 in FIG. 12B corresponds to the cross section along line A1-A2 in FIG. 12A.

In the transistor 450 described in this embodiment, a drain electrode 408b is partly surrounded by a source electrode 408a having a U-shape (a C-shape, a reversed C-shape, or a horseshoe shape). With such a shape, even when the area of the transistor is small, a sufficient channel width can be secured, so that the on-state current of the transistor can be increased.

When a large amount of parasitic capacitance is generated between the gate electrode 414 and the drain electrode 408b electrically connected to the pixel electrode 431, the liquid crystal element 446 is more likely to be affected by a feedthrough; therefore, a potential supplied to the liquid crystal element 446 cannot be accurately stored, which leads to deterioration in display quality. As described in this embodiment, by employing the shape in which the drain electrode 408b is surrounded by the source electrode 408a having a U-shape, a sufficient channel width can be secured and the parasitic capacitance generated between the drain electrode 408b and the gate electrode 414 can be reduced, so that display quality of the liquid crystal display device can be improved.

In the cross section along A1-A2, a base insulating film 402 is formed over a substrate 400 and the gate electrode 414 is formed over the base insulating film 402. A gate insulating film 412 and an oxide semiconductor film 406 are formed over the gate electrode 414. The source electrode 408a and the drain electrode 408b are formed over the oxide semiconductor film 406. An interlayer insulating film 416 is formed over the source electrode 408a and the drain electrode 408b and in contact with part of the oxide semiconductor film 406. The pixel electrode 431 is formed over the interlayer insulating film 416. The pixel electrode 431 is electrically connected to the drain electrode 408b through a contact hole 415 formed in the interlayer insulating film 416.

Further, parts of the gate insulating film 412, the oxide semiconductor film 406, and the interlayer insulating film 416 are removed and the pixel electrode 431 is formed in contact with side surfaces of the gate insulating film 412, the oxide semiconductor film 406, and the interlayer insulating film 416. In this embodiment, an i-type (intrinsic) or substantially i-type oxide semiconductor is used for the oxide semiconductor film 406. The i-type or substantially i-type oxide semiconductor can be regarded as substantially an insulator, so that when the pixel electrode 431 is in contact with an end portion of the oxide semiconductor film 406, a problem of leakage current or the like does not occur.

Next, a method for manufacturing the pixel portion of the liquid crystal display device described with reference to FIGS. 12A and 12B is described with reference to FIGS. 13A to 13F.

First, the base insulating film 402 is formed over the substrate 400. The substrate 400 and the base insulating film 402 may have structures similar to those of the substrate 100 and the base insulating film 102 respectively.

Figure 13A:
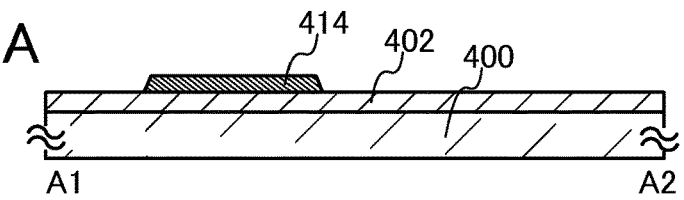
FIGS. 13A to 13F are cross-sectional views showing an example of a process of manufacturing a pixel in a display device that is one embodiment of the present invention.

Next, a conductive film is formed over the base insulating film 402, a resist mask is formed through a photolithography step, and the conductive film is processed to form the gate electrode 414 (see FIG. 13A). Although not shown, a capacitor wiring 447 and the wiring 444 are formed at the same time. The gate electrode 414 may have a structure similar to that of the gate electrode 114.

A material of the conductive film may be similar to that of the gate electrode 114 shown in Embodiment 1.

Next, the gate insulating film 412 is formed over the gate electrode 414. The gate insulating film 412 may have a structure similar to that of the gate insulating film 112.

The gate insulating film 412 also functions as a protective layer. The gate electrode 414 including Cu is covered with an insulating film including silicon nitride, whereby diffusion of Cu from the gate electrode 414 can be prevented.

Next, the oxide semiconductor film 406 is formed over the gate insulating film 412. The oxide semiconductor film 406 may have a structure similar to that of the oxide semiconductor film 106.

After the formation of the oxide semiconductor film 406, the substrate 400 may be subjected to plasma treatment or heat treatment. By performing the plasma treatment or the heat treatment on the substrate 400, hydrogen in the oxide semiconductor film 406 can be reduced, which is preferable. The plasma treatment is preferably performed in an oxidizing atmosphere. The heat treatment is performed in an inert atmosphere, a reduced-pressure atmosphere, or an oxidizing atmosphere. The heat treatment temperature is set at higher than or equal to 100° C. and lower than or equal to 400° C., preferably higher than or equal to 200° C. and lower than or equal to 350° C., more preferably higher than or equal to 250° C. and lower than or equal to 300° C.

Figure 13B:
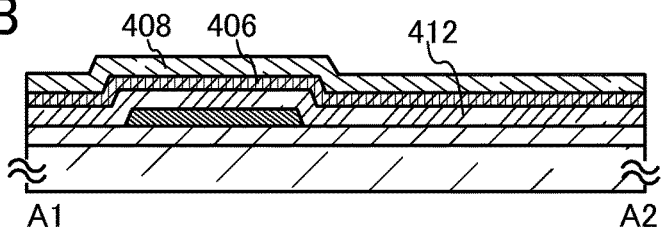
Figure 13C:
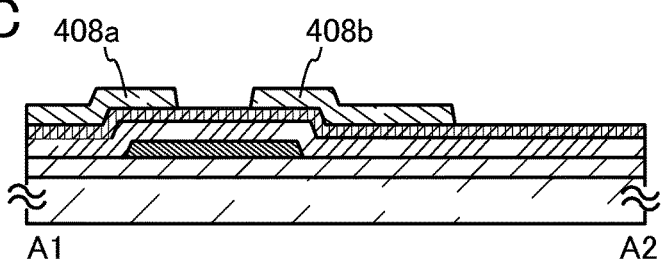

Next, a conductive film 408 is formed over the oxide semiconductor film 406 (see FIG. 13B). The conductive film 408 may have a structure similar to that of the conductive film serving as the source electrode 108a and the drain electrode 108b.

Here, the steps from the formation of the oxide semiconductor film 406 to the formation of the conductive film 408 are performed without exposure to the air. Without exposure to the air, hydrogen in the film and the interface between the films can be removed. Note that the steps from the formation of the oxide semiconductor film 406 to the formation of the conductive film 408 may be performed with the use of the multi-chamber film formation apparatus shown in FIG. 3.

Next, a resist mask is formed over the conductive film 408 through a photolithography step and the conductive film 408 is processed to form the source electrode 408a and the drain electrode 408b. Although not shown, the wiring 440 is formed at the same time (see FIG. 13C).

Figure 13D:
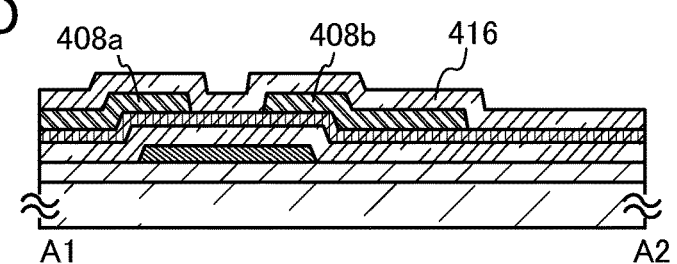
Figure 13E:
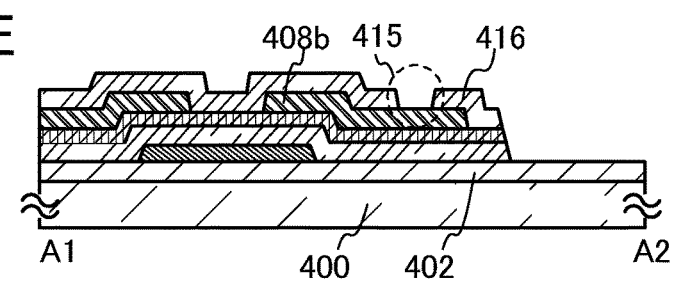

Next, the interlayer insulating film 416 is formed over the source electrode 408a and the drain electrode 408b (see FIG. 13D). The interlayer insulating film 416 may have a structure similar to that of the interlayer insulating film 216.

Then, a resist mask is formed over the interlayer insulating film 416 through a photolithography step and the interlayer insulating film 416, the oxide semiconductor film 406, and the gate insulating film 412 are processed. At this time, only part of the interlayer insulating film 416 is removed over the drain electrode 408b, so that the contact hole 415 is formed (see FIG. 13E).

At this time, parts of the interlayer insulating film 416, the oxide semiconductor film 406, and the gate insulating film 412 in a pixel opening portion (a portion in a pixel where wirings or transistors are not provided) may be left. Note that by removing the parts of the interlayer insulating film 416 and the oxide semiconductor film 406 as much as possible, the transmittance of the pixel in the case where the liquid crystal display device is used as a transmissive liquid crystal display device is improved. Thus, light from a backlight is efficiently transmitted through the pixel, whereby power consumption can be reduced and display quality can be improved due to improvement in luminance, which is preferable.

Etching of the interlayer insulating film 416, the oxide semiconductor film 406, and the gate insulating film 412 may be performed by either dry etching or wet etching, or both. A gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for dry etching.

As a dry etching method, a parallel plate reactive ion etching (RIE) method, an inductively coupled plasma (ICP) etching method, or the like can be used.

In general, etching of a semiconductor film and formation of a contact hole in an insulating film are separately performed through different photolithography steps and etching steps. However, according to the manufacturing steps described in this embodiment, the etching of a semiconductor film and the formation of a contact hole can be performed at the same time through one photolithography step and one etching step. Consequently, not only the number of photo masks but also the number of photolithography steps can be reduced. In other words, because of the reduced number of photolithography steps, a liquid crystal display device can be manufactured at low cost with high productivity.

Further, according to the manufacturing steps described in this embodiment, a photoresist is not formed directly on the oxide semiconductor film. A channel formation region of the oxide semiconductor film 406 is protected by the interlayer insulating film 416, whereby moisture is not attached to the channel formation region of the oxide semiconductor film 406 in a peeling step of the photoresist; therefore, variation in the characteristics of the transistor 450 is reduced and the reliability is improved.

Figure 13F:
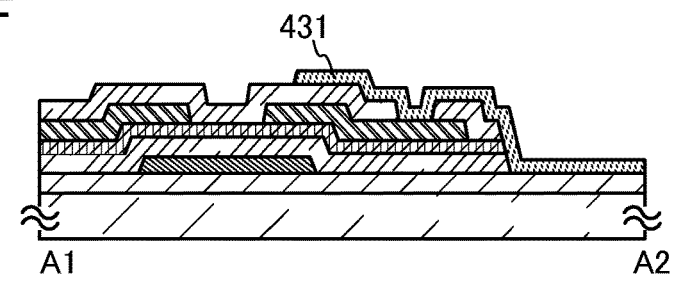

Next, a conductive film is formed over the interlayer insulating film 416, a resist mask is formed over the conductive film through a photolithography step, and the conductive film is processed to form the pixel electrode 431 (see FIG. 13F). The pixel electrode 431 can have a structure similar to that of the back gate electrode 224. Note that a back gate electrode may be formed by processing the conductive film. By provision of the back gate electrode, the threshold voltage of the transistor can be controlled.

The pixel electrode 431 is electrically connected to the drain electrode 408b through the contact hole 415.

According to this embodiment, a pixel of a liquid crystal display device can be manufactured with a reduced number of photolithography steps compared to the number of photolithography steps in a conventional manufacturing method. Consequently, a liquid crystal display device can be manufactured at low cost with high productivity.

According to this embodiment, hydrogen in the film and the interface between the films can be removed, so that a transistor with less variation in the threshold voltage and stable electrical characteristics is provided. Further, hydrogen in a film in contact with an oxide semiconductor film can be reduced, whereby entry of hydrogen into the oxide semiconductor film can be suppressed. Thus, a semiconductor device having a transistor with favorable electrical characteristics and high reliability can be provided.

Further, the number of apparatuses needed for manufacture of a transistor can be reduced with the use of a multi-chamber film formation apparatus.

This embodiment can be freely combined with other embodiments.

Embodiment 6

In this embodiment, an example of a transistor capable of high-speed operation and having high reliability will be described with reference to FIG. 17.

Figure 17:
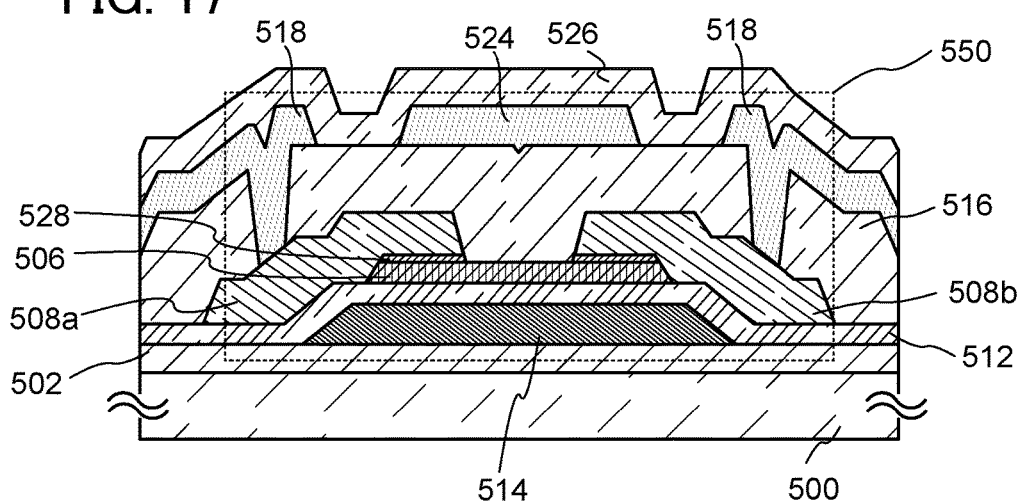
FIG. 17 is a cross-sectional view showing an example of a semiconductor device that is one embodiment of the present invention.

FIG. 17 is a cross-sectional view of a bottom-gate bottom-contact transistor 550. The transistor 550 includes a substrate 500, a base insulating film 502 provided over the substrate 500, a gate electrode 514 provided over the base insulating film 502, a gate insulating film 512 covering the gate electrode 514, an oxide semiconductor film 506 provided over the gate electrode 514 with the gate insulating film 512 interposed therebetween, a source electrode 508a and a drain electrode 508b which are connected to the oxide semiconductor film 506 through an oxide conductive film 528, a wiring 518 connected to the source electrode 508a and the drain electrode 508b through a contact hole formed in the interlayer insulating film 516, a back gate electrode 524 provided over the same surface as the wiring 518 and facing the gate electrode 514 with the oxide semiconductor film 506 interposed therebetween, and a protective insulating film 526 covering the back gate electrode 524 and the wiring 518 and being partly in contact with the interlayer insulating film 516. Note that the oxide conductive film 528 and/or the base insulating film 502 are/is not necessarily included.

The substrate 500, the gate electrode 514, the gate insulating film 512, the oxide semiconductor film 506, the oxide conductive film 528, and the interlayer insulating film 516 may have structures similar to those of the substrate 200, the gate electrode 214, the gate insulating film 212, the oxide semiconductor film 206, the oxide conductive film 228, and the interlayer insulating film 216 respectively.

The source electrode 508a and the drain electrode 508b are formed of a Ti film, a W film, or the like to have a thickness of greater than or equal to 50 nm and less than or equal to 150 nm.

The back gate electrode 524 and the wiring 518 may have a layered structure in which an Al film is sandwiched between Ti films or a layered structure in which an Al film is sandwiched between Mo films. With such a structure, the resistance of the wiring 518 can be lowered and the operation speed of the transistor 550 can be improved.

Moreover, the thicknesses of the source electrode 508a and the drain electrode 508b can be reduced, whereby the coverage with the interlayer insulating film 516 in a step portion formed due to the source electrode 508a and the drain electrode 508b can be increased. For this reason, the reliability of the transistor can be improved.

Further, the protective insulating film 526 may include an aluminum oxide film, a silicon nitride film, or a silicon nitride oxide film. With such a structure, entry of hydrogen into the transistor 550 from the outside can be suppressed.

According to this embodiment, a transistor capable of high-speed operation and having high reliability can be manufactured.

Embodiment 7

One embodiment of a film formation method for an oxide semiconductor film that can be used for a semiconductor film of a transistor in Embodiments 1 to 6 will be described.

An oxide semiconductor film in this embodiment is a crystalline oxide semiconductor film.

First, a base insulating film is formed over a substrate.

Next, an oxide semiconductor film having a thickness greater than or equal to 1 nm and less than or equal to 50 nm, preferably greater than or equal to 5 nm and less than or equal to 30 nm is formed over the base insulating film. A sputtering method is used for the formation of the oxide semiconductor film. The substrate temperature during the film formation is higher than or equal to 100° C. and lower than or equal to 500° C., preferably higher than or equal to 200° C. and lower than or equal to 400° C., more preferably higher than or equal to 250° C. and lower than or equal to 300° C.

In this embodiment, the oxide semiconductor film is formed to have a thickness of 25 nm in an oxygen atmosphere, an argon atmosphere, or a mixed atmosphere of argon and oxygen in the conditions where a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 60 mm, the substrate temperature is 300° C., the pressure is 0.4 Pa, and the direct current (DC) power source is 0.5 kW.

Next, the atmosphere in the chamber in which the substrate is put is set to a nitrogen atmosphere or dry air, and heat treatment may be performed. The temperature of the heat treatment is higher than or equal to 200° C. and lower than or equal to 750° C., preferably higher than or equal to 250° C. and lower than or equal to 400° C. Crystallinity of the crystalline oxide semiconductor film can be improved by the heat treatment.

Here, the steps of the formation of the base insulating film, the formation of the crystalline semiconductor film, and the heat treatment on the substrate are preferably performed without exposure to the air with the use of the multi-chamber film formation apparatus shown in FIG. 3. Without exposure to the air, hydrogen in the film and interface between the films can be removed.

Further, by the heat treatment, oxygen in the base insulating film is diffused into an interface between the base insulating film and the crystalline oxide semiconductor film or the vicinity of the interface (within ±5 nm from the interface), so that oxygen deficiency in the crystalline oxide semiconductor film and the interface state between the base insulating film and the crystalline oxide semiconductor film can be reduced.

Note that the crystalline oxide semiconductor film comprises an oxide including a crystal with c-axis alignment (also referred to as C-Axis Aligned Crystal (CAAC)), which has neither a single crystal structure nor an amorphous structure. Note that the crystalline oxide semiconductor film partly includes a crystal grain boundary.

In particular, in the transistor in Embodiment 1 in which the oxide semiconductor of this embodiment is used as an oxide semiconductor film, an electric field is not applied from one surface to the other surface of the oxide semiconductor film and current does not flow in the thickness direction of the oxide semiconductor. For this reason, the transistor has a structure in which current mainly flows along the interface of the stack of the oxide semiconductor; therefore, even when the transistor is irradiated with light or even when a bias-temperature (BT) stress is applied to the transistor, deterioration of electrical characteristics is suppressed or reduced.

When a crystalline oxide semiconductor film is used for a transistor, the transistor can have stable electrical characteristics and high reliability.

This embodiment can be implemented in appropriate combination with the structures described in the other embodiments.

Embodiment 8

Figure 14A:
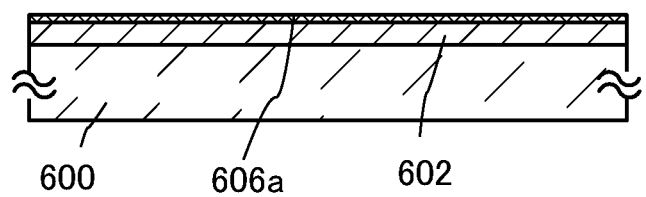
FIGS. 14A to 14C are cross-sectional views showing an example of a process of manufacturing an oxide semiconductor film that is one embodiment of the present invention.
Figure 14B:
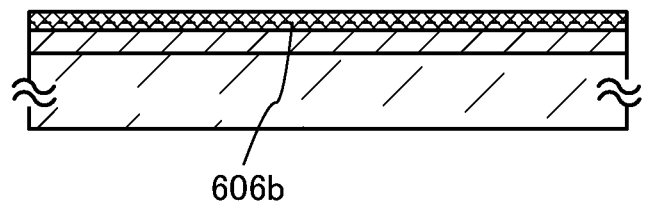

One embodiment of a film formation method for an oxide semiconductor film that can be used for a semiconductor film of a transistor in Embodiments 1 to 6 will be described using FIGS. 14A to 14C.

The oxide semiconductor film of this embodiment has a layered structure including a first crystalline oxide semiconductor film and a second crystalline oxide semiconductor film thereover which is thicker than the first crystalline oxide semiconductor film.

First, a base insulating film 602 is formed over a substrate 600.

Next, a first oxide semiconductor film having a thickness greater than or equal to 1 nm and less than or equal to 10 nm is formed over the base insulating film 602. A sputtering method is used for the formation of the first oxide semiconductor film. The substrate temperature during the film formation is higher than or equal to 100° C. and lower than or equal to 500° C., preferably higher than or equal to 200° C. and lower than or equal to 400° C., more preferably higher than or equal to 250° C. and lower than or equal to 300° C.

In this embodiment, the first oxide semiconductor film having a thickness of 5 nm is formed using a target for an oxide semiconductor (a target for an In—Ga—Zn—O-based oxide semiconductor containing $In_2O_3$, $Ga_2O_3$, and ZnO at 1:1:2 [molar ratio]), with a distance between the substrate and the target of 60 mm, a substrate temperature of 300° C., a pressure of 0.4 Pa, and a direct current (DC) power source of 0.5 kW in an atmosphere of only oxygen, only argon, or argon and oxygen.

Next, the atmosphere in the chamber in which the substrate is put is set to a nitrogen atmosphere or dry air, and first crystallization heat treatment is performed. The temperature of the first crystallization heat treatment is higher than or equal to 400° C. and lower than or equal to 750° C. A first crystalline oxide semiconductor film 606a is formed by the first crystallization heat treatment (see FIG. 14A).

Depending on the temperature of the first crystallization heat treatment, the first crystallization heat treatment causes crystallization from a film surface and crystal growth from the film surface toward the inside of the film; thus, c-axis aligned crystal is obtained. By the first crystallization heat treatment, the proportions of zinc and oxygen in the film surface are increased, and one or more layers of graphene-type two-dimensional crystal including zinc and oxygen and having a hexagonal upper plane are formed at the outermost surface; the layers grow in the thickness direction to overlap with each other. By an increase in the temperature of the crystallization heat treatment, the crystal growth proceeds from the surface to the inside and further from the inside to the bottom.

By the first crystallization heat treatment, oxygen in the base insulating film 602 is diffused into an interface between the base insulating film 602 and the first crystalline oxide semiconductor film 606a or the vicinity of the interface (within ±5 nm from the interface), so that oxygen deficiency in the first crystalline oxide semiconductor film 606a and the interface state between the base insulating film 602 and the first crystalline oxide semiconductor film 606a can be reduced.

Next, a second oxide semiconductor film having a thickness greater than 10 nm is formed over the first crystalline oxide semiconductor film 606a. In formation of the second crystalline oxide semiconductor film, a sputtering method is used, and a substrate temperature is higher than or equal to 100° C. and lower than or equal to 500° C., preferably higher than or equal to 200° C. and lower than or equal to 400° C., more preferably higher than or equal to 250° C. and lower than or equal to 300° C. With a substrate temperature higher than or equal to 100° C. and lower than or equal to 500° C. in the film formation, precursors can be arranged in the oxide semiconductor film formed over and in contact with the surface of the first crystalline oxide semiconductor film and so-called orderliness can be obtained.

In this embodiment, the second oxide semiconductor film is formed to have a thickness of 25 nm in an oxygen atmosphere, an argon atmosphere, or a mixed atmosphere of argon and oxygen in the conditions where a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 60 mm, the substrate temperature is 400° C., the pressure is 0.4 Pa, and the direct current (DC) power source is 0.5 kW.

Then, second crystallization heat treatment is performed. The temperature of the second crystallization heat treatment is higher than or equal to 400° C. and lower than or equal to 750° C. A second crystalline oxide semiconductor film 606b is formed by the second crystallization heat treatment (see FIG. 14B). Here, the second crystalline heat treatment is preferably performed in a nitrogen atmosphere, an oxygen atmosphere, or a mixed atmosphere of argon and oxygen so that the density of the second crystalline oxide semiconductor film can be increased and the number of defects therein can be reduced. By the second crystallization heat treatment, crystal growth proceeds in the thickness direction with the use of the first crystalline oxide semiconductor film 606a as a nucleus, that is, crystal growth proceeds from the bottom to the inside; thus, the second crystalline oxide semiconductor film 606b is formed.

It is preferable that the steps from the formation of the base insulating film 602 to the second crystalline heat treatment be performed successively without exposure to the air. For example, the multi-chamber film formation apparatus shown in FIG. 3 may be used. The atmospheres of the film formation chambers 10a, 10b, and 10c, the transfer chamber 13, and the substrate processing chamber 15 are preferably controlled so as to hardly contain hydrogen and moisture (i.e., as an inert atmosphere, a reduced-pressure atmosphere, or a dry air atmosphere). For example, a preferable atmosphere is a dry nitrogen atmosphere in which the dew point of moisture is lower than or equal to −40° C., preferably lower than or equal to −50° C. An example of a procedure of the manufacturing steps with use of the film formation apparatus shown in FIG. 3 is as follows. The substrate 600 is first transferred from the substrate supply chamber 11 to the substrate processing chamber 15 through the load lock chamber 12a and the transfer chamber 13; hydrogen adhering to the substrate 600 is removed by vacuum baking or the like in the substrate processing chamber 15; the substrate 600 is then transferred to the film formation chamber 10c through the transfer chamber 13; and the base insulating film 602 is formed in the film formation chamber 10c. Then, the substrate 600 is transferred to the film formation chamber 10a through the transfer chamber 13 without exposure to the air, and the first oxide semiconductor film having a thickness of 5 nm is formed in the film formation chamber 10a. Then, the substrate 600 is transferred to the substrate processing chamber 15 though the transfer chamber 13 without exposure to the air and first crystallization heat treatment is performed. Then, the substrate 600 is transferred to the film formation chamber 10a through the transfer chamber 13, and the second oxide semiconductor film having a thickness greater than 10 nm is formed in the film formation chamber 10a. Then, the substrate 600 is transferred to the substrate processing chamber 15 through the transfer chamber 13, and second crystallization heat treatment is performed. As described above, with use of the film formation apparatus shown in FIG. 3, a manufacturing process can proceed without exposure to the air. Further, after a stack of the base insulating film 602, the first crystalline oxide semiconductor film, and the second crystalline oxide semiconductor film is formed, in the film formation chamber 10b, a conductive film for forming a source electrode and a drain electrode can be formed over the second crystalline oxide semiconductor film with use of a metal target, without exposure to the air. Note that the first crystalline oxide semiconductor film and the second crystalline oxide semiconductor film may be formed in separate film formation chambers for improvement of the throughput.

Figure 14C:
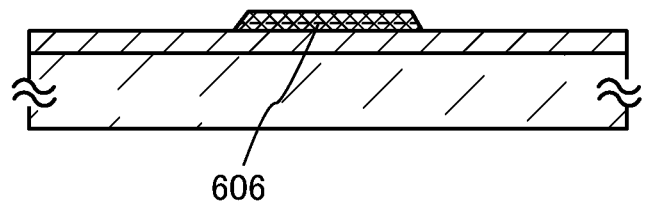

Next, a stack of oxide semiconductor films including the first crystalline oxide semiconductor film 606a and the second crystalline oxide semiconductor film 606b is processed to form an oxide semiconductor film 606 including the island-shaped stack of the oxide semiconductor films (see FIG. 14C). In the drawings, the interface between the first crystalline oxide semiconductor film 606a and the second crystalline oxide semiconductor film 606b is indicated by a dashed line for description of the stack of the oxide semiconductor films; however, the interface is actually not distinct and is shown for easy understanding.

The stack of the oxide semiconductor films can be processed by being etched after a mask having a desired shape is formed over the stack of the oxide semiconductor films. The mask may be formed by a method such as photolithography or an ink-jet method.

Further, one feature of the first crystalline oxide semiconductor film and the second crystalline oxide semiconductor film obtained by the above formation method is that they have c-axis alignment. However, the first crystalline oxide semiconductor film and the second crystalline oxide semiconductor film comprise CAAC. Note that the first crystalline oxide semiconductor film and the second crystalline oxide semiconductor film partly include a crystal grain boundary.

Note that the first crystalline oxide semiconductor film and the second crystalline oxide semiconductor film are each formed using an oxide material including at least Zn. For example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; a Zn—O-based material; or the like can be used. Further, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide material including indium (In), gallium (Ga), and zinc (Zn), and there is no particular limitation on the composition ratio. Further, the In—Ga—Zn—O-based material may contain an element other than In, Ga, and Zn.

Without limitation to the two-layer structure in which the second crystalline oxide semiconductor film is formed over the first crystalline oxide semiconductor film, a stack structure of three or more layers may be formed by repeatedly performing a process of film formation and crystallization heat treatment for forming a third crystalline oxide semiconductor film after the second crystalline oxide semiconductor film is formed.

The oxide semiconductor film 606 formed of the stack of the oxide semiconductor films formed by the above manufacturing method can be used as appropriate for a transistor which can be applied to the semiconductor device disclosed in this specification (e.g., the transistors 150, 250, 252, 350, and 450).

In the transistor 150 according to Embodiment 1, in which the stack of the oxide semiconductor films of this embodiment is used as the oxide semiconductor film 606, an electric field is not applied from one surface to the other surface of the oxide semiconductor film and current does not flow in the thickness direction (from one surface to the other surface; specifically, in the vertical direction in FIG. 4B) of the stack of the oxide semiconductor films. The transistor has a structure in which current mainly flows along the interface of the stack of the oxide semiconductor films; therefore, even when the transistor is irradiated with light or even when a bias-temperature (BT) stress is applied to the transistor, deterioration of electrical characteristics is suppressed or reduced.

By using a stack of a first crystalline oxide semiconductor film and a second crystalline oxide semiconductor film, like the oxide semiconductor film 606, a transistor having stable electrical characteristics and high reliability can be realized.

This embodiment can be implemented in appropriate combination with the structures described in the other embodiments.

Further, the number of apparatuses needed for manufacture of a transistor can be reduced with the use of a multi-chamber film formation apparatus.

Embodiment 9

Figure 15A:
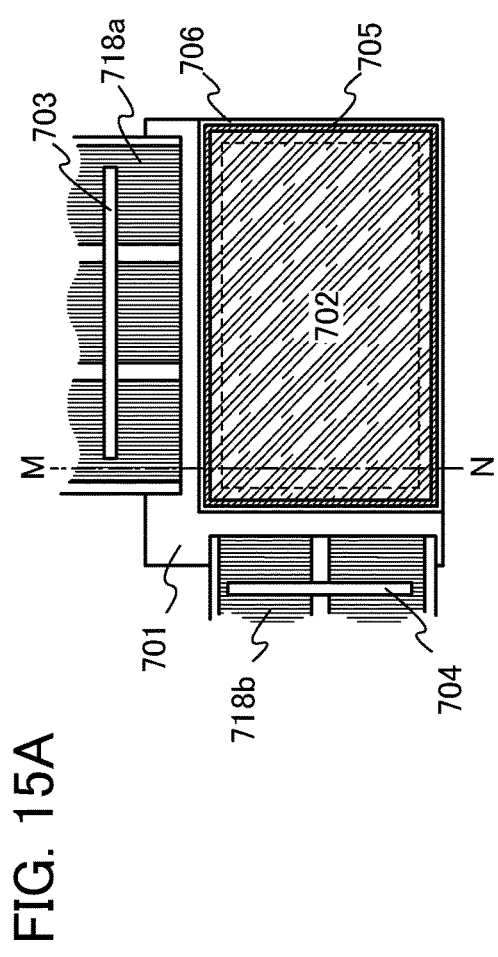
FIGS. 15A and 15B are a top view and a cross-sectional view showing an example of a display device that is one embodiment of the present invention.
Figure 15B:
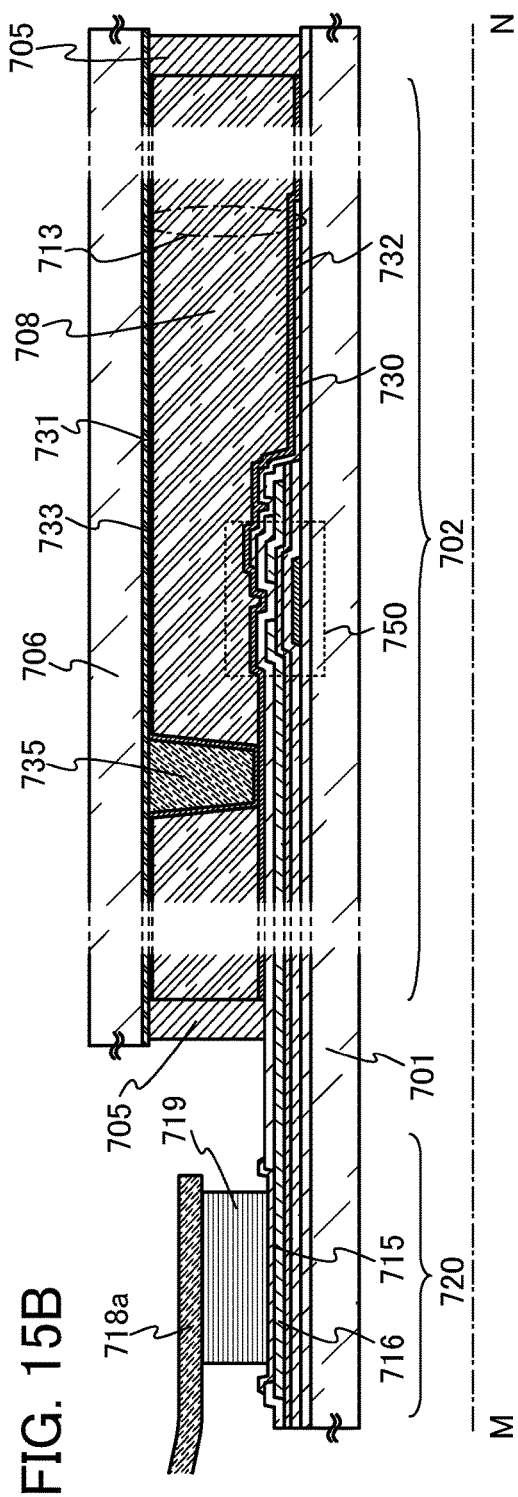

One mode of a display device using the transistor exemplified in Embodiments 1 to 6 is shown in FIGS. 15A and 15B.

FIG. 15A is a top view of a panel. In the panel, a transistor 750 and a liquid crystal element 713, which are formed over a first substrate 701, are sealed between the first substrate 701 and a second substrate 706 by a sealant 705. FIG. 15B corresponds to a cross sectional view along M-N in FIG. 15A.

The sealant 705 is provided so as to surround a pixel portion 702 provided over the first substrate 701. The second substrate 706 is provided over the pixel portion 702. Thus, the pixel portion 702 is sealed together with a liquid crystal layer 708 by the first substrate 701, the sealant 705, and the second substrate 706.

Further, an input terminal 720 is provided in a region that is different from a region surrounded by the sealant 705 over the first substrate 701 and is connected to flexible printed circuits (FPCs) 718a and 718b. The FPC 718a is electrically connected to a signal line driver circuit 703 separately manufactured over a different substrate and the FPC 718b is electrically connected to a scan line driver circuit 704 separately manufactured over a different substrate. Various signals and potentials supplied to the pixel portion 702 are supplied from the signal line driver circuit 703 and the scan line driver circuit 704 through the FPCs 718a and 718b.

Note that a connection method of a driver circuit which is separately formed over a different substrate is not particularly limited, and a chip on glass (COG) method, a wire bonding method, a tape carrier package (TCP) method, a tape automated bonding (TAB) method, or the like can be used.

As the display element provided in the display device, a liquid crystal element (also referred to as a liquid crystal display element) can be used. Furthermore, a display medium whose contrast is changed by an electric effect, such as electronic ink, can be used.

The display device shown in FIG. 15B includes an electrode 715 and a wiring 716. The electrode 715 and the wiring 716 are electrically connected to a terminal included in a FPC 718a through an anisotropic conductive film 719.

The electrode 715 is formed using the same conductive film as the first electrode 730. The wiring 716 is formed using the same conductive film as a source electrode and a drain electrode of the transistor 750.

Note that in this embodiment, the transistor 750 has a structure similar to that of the transistor 450 described in Embodiment 4; however, it is needless to say that the structure of the transistor is not limited thereto. The transistor may be replaced with the transistor manufactured in any of Embodiments 1 to 6 as appropriate. The transistor 750 provided in the pixel portion 702 is electrically connected to a display element to form a display panel. There is no particular limitation on the kind of display element as long as display can be performed, and a variety of kinds of display elements can be employed.

FIGS. 15A and 15B show an example of a liquid crystal display device using a liquid crystal element as a display element. In FIGS. 15A and 15B, the liquid crystal element 713 is a display element including the first electrode 730, a second electrode 731, and the liquid crystal layer 708. Note that insulating films 732 and 733 serving as alignment films are provided so that the liquid crystal layer 708 is interposed therebetween. The second electrode 731 is provided on the second substrate 706 side, and the first electrode 730 and the second electrode 731 are stacked with the liquid crystal layer 708 provided therebetween.

Further, a reference numeral 735 is a columnar spacer formed of an insulating film over the second substrate 706 in order to control the thickness (a cell gap) of the liquid crystal layer 708. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal showing a blue phase and a chiral agent has a small response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. The value of the specific resistivity in this specification is measured at 20° C.

The size of storage capacitor formed in the liquid crystal display device is set considering the leakage current of the transistor provided in the pixel portion or the like so that charge can be held for a predetermined period. By using a transistor including an oxide semiconductor for a semiconductor film in which a channel region is formed, it is enough to provide a storage capacitor having a capacitance that is ⅓ or less, preferably ⅕ or less of a liquid crystal capacitance of each pixel.

The current in an off state (the off-state current) of the transistor using an oxide semiconductor film used in this embodiment can be made small. Consequently, an electrical signal such as an image signal can be held for a longer period in the pixel, and a writing interval can be set longer in an on state. Consequently, frequency of refresh operation can be reduced, which leads to an effect of suppressing power consumption. Further, the transistor using an oxide semiconductor film can store a potential applied to a liquid crystal element without a storage capacitor.

The field-effect mobility of the transistor using an oxide semiconductor film used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super-view (ASV) mode, and the like can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer), an optical element (an optical substrate) such as a polarizing element, a retardation element, or an anti-reflection element, and the like are provided as appropriate. For example, circular polarization may be employed by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color liquid crystal display device and can be applied to a monochrome liquid crystal display device.

In FIGS. 15A and 15B, as the first substrate 701 and the second substrate 706, flexible substrates, for example, plastic substrates having a light-transmitting property or the like can be used, as well as glass substrates. As plastic, a fiberglass-reinforced plastics (FRP) plate, a polyvinyl fluoride (PVF) film, a polyester film, or an acrylic resin film can be used. Further, a sheet with a structure in which an aluminum foil is sandwiched between PVF films or polyester films can be used.

The liquid crystal display device performs display by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 730 and the second electrode 731 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added. Further, a material formed of 1 to 10 graphene sheets may be used.

One of the first electrode 730 and the second electrode 731 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

The first electrode 730 and the second electrode 731 can be formed using a conductive composition including a conductive macromolecule (also referred to as a conductive polymer). As the conductive macromolecule, a so-called π-electron conjugated conductive can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since a transistor is easily broken by static electricity or the like, a protection circuit is preferably provided. The protection circuit is preferably formed using a nonlinear element.

As described above, by using any of the transistors exemplified in Embodiments 1 to 7, a highly reliable liquid crystal display device can be provided. Note that the transistors described in Embodiments 1 to 7 can be applied to not only semiconductor devices having the display functions described above but also semiconductor devices having a variety of functions, such as a power device which is mounted on a power supply circuit, a semiconductor integrated circuit such as LSI, and a semiconductor device having an image sensor function of reading information of an object.

This embodiment can be freely combined with other embodiments.

Embodiment 10

A semiconductor device which is one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment will be described.

Figure 16A:
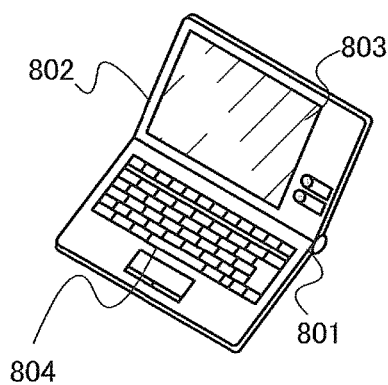
FIGS. 16A to 16F each show an example of an electronic device that is one embodiment of the present invention.

FIG. 16A shows a laptop personal computer including a main body 801, a housing 802, a display portion 803, a keyboard 804, and the like. By applying the semiconductor device described in Embodiments 1 to 8, the laptop personal computer can have high reliability.

Figure 16B:
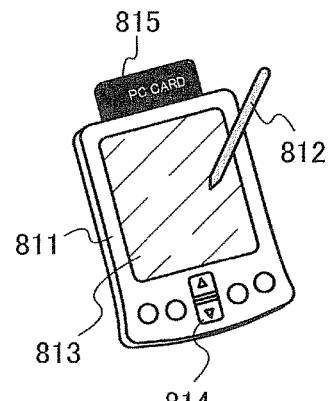

FIG. 16B shows a portable information terminal (PDA) which includes a display portion 813, an external interface 815, an operation button 814, and the like in a main body 811. A stylus 812 is included as an accessory for operation. By applying the semiconductor device described in Embodiments 1 to 8, the portable information terminal (PDA) can have higher reliability.

Figure 16C:
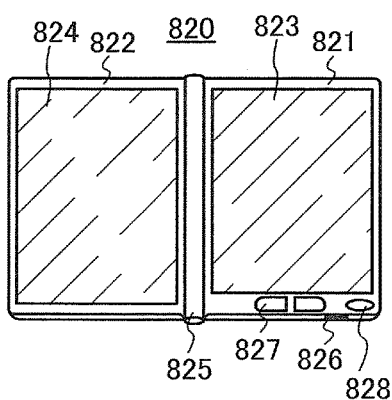

FIG. 16C shows an example of an e-book reader. For example, the e-book reader 820 includes two housings, a housing 821 and a housing 822. The housings 821 and 822 are bound with each other by an axis portion 825, along which the e-book reader 820 can be opened and closed. With such a structure, the e-book reader 820 can operate like a paper book.

A display portion 823 and a display portion 824 are incorporated in the housing 821 and the housing 822 respectively. The display portion 823 and the display portion 824 may display one image or different images. In the structure where the display portions display different images from each other, for example, the right display portion (the display portion 823 in FIG. 16C) can display text and the left display portion (the display portion 824 in FIG. 16C) can display images. By applying the semiconductor device described in Embodiments 1 to 8 can be, the e-book reader 820 can have high reliability.

Further, in FIG. 16C, the housing 821 is provided with an operation portion and the like. For example, the housing 821 is provided with a power switch 826, operation keys 827, a speaker 828, and the like. With the operation keys 827, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 820 may have a function of an electronic dictionary.

The e-book reader 820 may send and receive information wirelessly. Through wireless communication, desired book data or the like can be purchased and downloaded from an electronic book server.

Figure 16D:
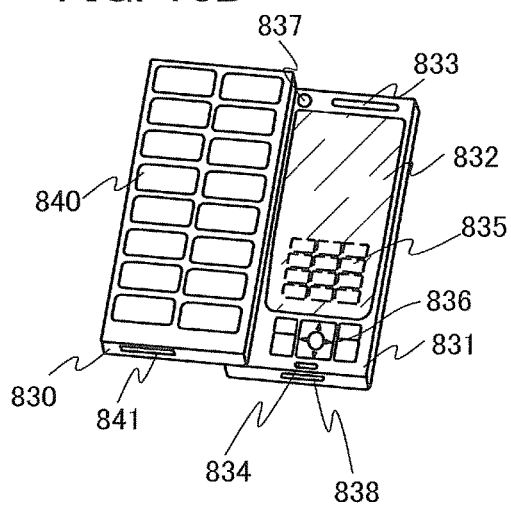

FIG. 16D shows a mobile phone, which includes two housings, a housing 830 and a housing 831. The housing 831 includes a display panel 832, a speaker 833, a microphone 834, a pointing device 836, a camera lens 837, an external connection terminal 838, and the like. The housing 830 includes a solar cell 840 for charging of the portable phone, an external memory slot 841, and the like. In addition, an antenna is incorporated in the housing 831. By applying the semiconductor device described in Embodiments 1 to 8, the mobile phone can have high reliability.

Further, the display panel 832 is provided with a touch panel. A plurality of operation keys 835 that are displayed as images are shown by dashed lines in FIG. 16D. A boosting circuit by which a voltage output from the solar cell 840 is increased to be sufficiently high for each circuit is also provided.

The display panel 832 changes the orientation of display as appropriate depending on the application mode. Further, the camera lens 837 is provided on the same surface as the display panel 832, and thus it can be used as a video phone. The speaker 833 and the microphone 834 can be used for operations such as video calls, sound recording, and playback without being limited to the voice call function. Further, the housing 830 and the housing 831 in a state where they are developed as shown in FIG. 16D can shift by sliding so that one is lapped over the other; therefore, the size of the mobile phone can be reduced, which makes the mobile phone suitable for being carried.

The external connection terminal 838 can be connected to an AC adapter and various types of cables such as a USB cable, and charging and data communication with a personal computer are possible. Furthermore, a large amount of data can be stored and transferred by inserting a recording medium into the external memory slot 841.

Further, in addition to the above functions, an infrared communication function, a television reception function, or the like may be provided.

Figure 16E:
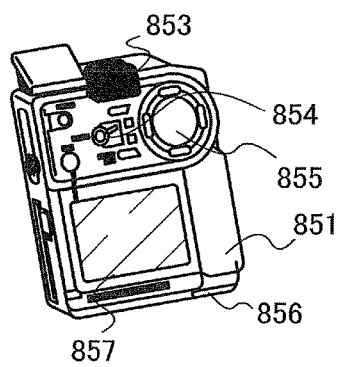

FIG. 16E shows a digital video camera, which includes a main body 851, a display portion (A) 857, an eyepiece 853, an operation switch 854, a display portion (B) 855, a battery 856, and the like. By applying the semiconductor device described in Embodiments 1 to 8, the digital video camera can have high reliability.

Figure 16F:
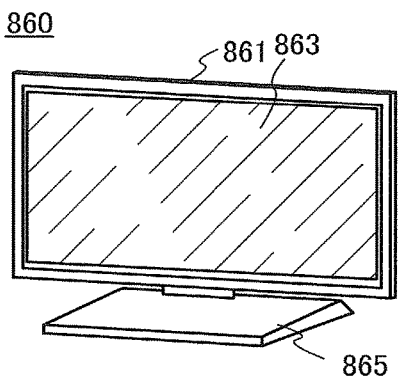

FIG. 16F shows an example of a television set. In the television set 860, a display portion 863 is incorporated in a housing 861. The display portion 863 can display images. Here, the housing 861 is supported by a stand 865. By applying the semiconductor device described in Embodiments 1 to 8, the television set 860 can have high reliability.

The television set 860 can be operated by an operation switch of the housing 861 or a separate remote controller. Further, the remote controller may be provided with a display portion for displaying data output from the remote controller.

Note that the television set 860 is provided with a receiver, a modem, and the like. Moreover, when the display device is connected to a communication network with or without wires via the modem, one-way (from a sender to a receiver) or two-way (between a sender and a receiver or between receivers) information communication can be performed.

The structures, the methods, and the like described in this embodiment may be combined as appropriate with any of the structures, the methods, and the like described in the other embodiments.

EXPLANATION OF REFERENCE

10*a*: film formation chamber, 10*b*: film formation chamber, 10*c*: film formation chamber, 11: substrate supply chamber, 12*a*: load lock chamber, 12*b*: load lock chamber, 13: transfer chamber, 14: cassette port, 15: substrate processing chamber, 100: substrate, 102: base insulating film, 106: oxide semiconductor film, 108*a*: source electrode, 108*b*: drain electrode, 112: gate insulating film, 114: gate electrode, 128: oxide conductive film, 150: transistor, 200: substrate, 202: base insulating film, 206: oxide semiconductor film, 208*a*: source electrode, 208*b*: drain electrode, 212: gate insulating film, 213: conductive film, 214: gate electrode, 216: interlayer insulating film, 222: conductive film, 224: back gate electrode, 226: protective insulating film, 228: oxide conductive film, 250: transistor, 252: transistor, 308: conductive film, 308*a*: source electrode, 308*b*: drain electrode, 328: oxide conductive film, 350: transistor, 400: substrate, 402: base insulating film, 406: oxide semiconductor film, 408: conductive film, 408*a*: source electrode, 408*b*: drain electrode, 412: gate insulating film, 414: gate electrode, 415: contact hole, 416: interlayer insulating film, 431: pixel electrode, 440: wiring, 442: pixel, 444: wiring, 445: electrode, 446: liquid crystal element, 447: capacitor wiring, 448: capacitor, 450: transistor, 500: substrate, 502: base insulating film, 506: oxide semiconductor film, 508*a*: source electrode, 508*b*: drain electrode, 512: gate insulating film, 514: gate electrode, 516: interlayer insulating film, 518: wiring, 524: back gate electrode, 526: protective insulating film, 528: oxide conductive film, 550: transistor, 600: substrate, 602: base insulating film, 606: oxide semiconductor film, 606*a*: crystalline oxide semiconductor film, 606*b*: crystalline oxide semiconductor film, 701: substrate, 702: pixel portion, 703: signal line driver circuit,

704: scan line driver circuit, 705: sealant, 706: substrate, 708: liquid crystal layer, 713: liquid crystal element, 715: electrode, 716: wiring, 718*a*: FPC, 718*b*: FPC, 719: anisotropic conductive film, 720: input terminal, 730: electrode, 731: electrode, 732: insulating film, 733: insulating film, 750: transistor, 801: main body, 802: housing, 803: display portion, 804: keyboard, 811: main body, 812: stylus, 813: display portion, 814: operation button, 815: external interface, 820: e-book reader, 821: housing, 822: housing, 823: display portion, 824: display portion, 825: axis portion, 826: power switch, 827: operation key, 828: speaker, 830: housing, 831: housing, 832: display panel, 833: speaker, 834: microphone, 835: operation key, 836: pointing device, 837: camera lens, 838: external connection terminal, 840: solar cell, 841: external memory slot, 851: main body, 853: eyepiece, 854: operation switch, 855: display portion (B), 856: battery, 857: display portion (A), 860: television set, 861: housing, 863: display portion, and 865: stand.

This application is based on Japanese Patent Application serial No. 2010-197749 filed with Japan Patent Office on Sep. 3, 2010 and Japanese Patent Application serial No. 2010-287403 filed with Japan Patent Office on Dec. 24, 2010, the entire contents of which are hereby incorporated by reference.

The invention claimed is:

1. A method for manufacturing a semiconductor device, comprising:
    forming an oxide semiconductor layer over a substrate while heating the substrate;
    forming an island-shaped oxide semiconductor layer by patterning the oxide semiconductor layer;
    forming a source electrode and a drain electrode over the island-shaped oxide semiconductor layer by etching a conductive layer;
    supplying oxygen to the island-shaped oxide semiconductor layer after forming the source electrode and the drain electrode;
    forming an oxide insulating layer over the island-shaped oxide semiconductor layer, the source electrode, and the drain electrode; and
    forming a gate electrode over the oxide insulating layer,
    wherein each of the source electrode and the drain electrode comprises a nitride of a metal element.

2. The method for manufacturing a semiconductor device according to claim 1, wherein the metal element is tantalum.

3. The method for manufacturing a semiconductor device according to claim 1,
    wherein the supplying oxygen to the island-shaped oxide semiconductor layer is performed before forming the oxide insulating layer.

4. The method for manufacturing a semiconductor device according to claim 1,
    wherein the island-shaped oxide semiconductor layer comprises a channel formation region, and
    wherein a portion of the conductive layer over the channel formation region is etched at the step of forming the source electrode and the drain electrode.

5. The method for manufacturing a semiconductor device according to claim 1,
    wherein a surface of the island-shaped oxide semiconductor layer is exposed at the step of forming the source electrode and the drain electrode.

6. The method for manufacturing a semiconductor device according to claim 1,
    wherein the oxide insulating layer comprises aluminum oxide.

7. A method for manufacturing a semiconductor device, comprising:
    forming an oxide semiconductor layer over a substrate while heating the substrate;
    forming an island-shaped oxide semiconductor layer by patterning the oxide semiconductor layer;
    forming a source electrode and a drain electrode over the island-shaped oxide semiconductor layer by etching a conductive layer;
    supplying oxygen to the island-shaped oxide semiconductor layer after forming the source electrode and the drain electrode;
    forming an oxide insulating layer over the island-shaped oxide semiconductor layer, the source electrode, and the drain electrode;
    performing a heat treatment after forming the oxide insulating layer; and
    forming a gate electrode over the oxide insulating layer,
    wherein each of the source electrode and the drain electrode comprises a nitride of a metal element.

8. The method for manufacturing a semiconductor device according to claim 7, wherein the metal element is tantalum.

9. The method for manufacturing a semiconductor device according to claim 7,
    wherein the island-shaped oxide semiconductor layer comprises a channel formation region, and
    wherein a portion of the conductive layer over the channel formation region is etched at the step of forming the source electrode and the drain electrode.

10. The method for manufacturing a semiconductor device according to claim 7,
    wherein a surface of the island-shaped oxide semiconductor layer is exposed at the step of forming the source electrode and the drain electrode.

11. The method for manufacturing a semiconductor device according to claim 7,
    wherein the oxide insulating layer comprises aluminum oxide.

12. The method for manufacturing a semiconductor device according to claim 7, wherein a temperature in the step of performing the heat treatment is higher than or equal to 250° C. and lower than 350° C.

13. A method for manufacturing a semiconductor device, comprising:
    forming an oxide semiconductor layer over a substrate while heating the substrate;
    forming a conductive layer over the oxide semiconductor layer;
    forming a source electrode and a drain electrode over the oxide semiconductor layer by etching the conductive layer;
    forming an oxide insulating layer over the oxide semiconductor layer, the source electrode, and the drain electrode;
    performing a heat treatment after forming the oxide insulating layer; and
    forming a gate electrode over the oxide insulating layer,
    wherein each of the source electrode and the drain electrode comprises a nitride of a metal element.

14. The method for manufacturing a semiconductor device according to claim 13, wherein the metal element is tantalum.

15. The method for manufacturing a semiconductor device according to claim 13,
    wherein the oxide semiconductor layer comprises a channel formation region, and wherein a portion of the conductive layer over the channel formation region is etched at the step of forming the source electrode and the drain electrode.

16. The method for manufacturing a semiconductor device according to claim 13,
wherein a surface of the oxide semiconductor layer is exposed at the step of forming the source electrode and the drain electrode.

17. The method for manufacturing a semiconductor device according to claim 13,
wherein the oxide insulating layer comprises aluminum oxide.

18. The method for manufacturing a semiconductor device according to claim 13, wherein a temperature in the step of performing the heat treatment is higher than or equal to 250° C. and lower than 350° C.

* * * * *